United States Patent [19]
Jacobsen et al.

[11] Patent Number: 5,804,919
[45] Date of Patent: Sep. 8, 1998

[54] RESONANT MICROCAVITY DISPLAY

[75] Inventors: Stuart M. Jacobsen, Powder Springs, Ga.; Steven M. Jaffe, Palo Alto, Calif.; Hergen Eilers, Blacksburg, Va.; Michieal L. Jones, Athens, Ga.; Irving Jaffe, London, England

[73] Assignee: University of Georgia Research Foundation, Inc., Athens, Ga.

[21] Appl. No.: 581,622

[22] PCT Filed: Jul. 20, 1994

[86] PCT No.: PCT/US94/08306

§ 371 Date: Jan. 18, 1996

§ 102(e) Date: Jan. 18, 1996

[87] PCT Pub. No.: WO95/03621

PCT Pub. Date: Feb. 2, 1995

[51] Int. Cl.$^6$ .............................. H01J 29/18; H01J 29/29; G02B 5/18
[52] U.S. Cl. ........................... 313/506; 313/509; 313/461; 313/113; 313/463
[58] Field of Search ..................................... 313/461, 466, 313/474, 506, 509, 113, 463; 359/109; 346/161; 428/690, 917

[56] References Cited

U.S. PATENT DOCUMENTS

| | | |
|---|---|---|
| 3,982,151 | 9/1976 | Ludovici et al. . |
| 4,298,820 | 11/1981 | Bongers et al. . |
| 4,539,687 | 9/1985 | Gordon et al. . |
| 4,642,695 | 2/1987 | Iwasaki . |
| 4,695,732 | 9/1987 | Ward . |
| 4,695,762 | 9/1987 | Bertstresser et al. . |
| 4,937,661 | 6/1990 | Van Der Voort . |
| 4,995,043 | 2/1991 | Kuwata et al. . |
| 5,089,860 | 2/1992 | Deppe et al. . |
| 5,126,626 | 6/1992 | Iwasaki . |
| 5,137,598 | 8/1992 | Thomas . |
| 5,226,053 | 7/1993 | Cho et al. . |
| 5,289,018 | 2/1994 | Okuda et al. . |
| 5,363,398 | 11/1994 | Glass et al. . |
| 5,478,658 | 12/1995 | Dodabalapur et al. . |

OTHER PUBLICATIONS

R.H. Mauch, et al., "Optical Behaviour of Electroluminescent Devices", Springer Proceedings in Physics, vol. 38, pp. 291–295 (1989).

Vlasenko, et al., "Interference of Luminescent Emission from an Evaporated Phosphor", Opt. Spect., vol. 11, pp. 216–219 (1961).

N.A. Vlasenko, et al., "Investigation of Interference Effects in Thin Electroluminescent ZnS–Mn Films", Opt. Spect., vol. 28, pp. 68–71 (1970).

Poelman, et al., "Spectral Shifts in Thin Film Electroluminescent Devices: An Interference Effect":, J. Phys. D: App. Phys., vol. 25, pp. 1010–1013 (1992).

R.T. Tuenge, "Current Status of Color TFEL Phosphors," Electroluminescence—Proceedings of the Sixth International Workshop on Electroluminescence, El Paso, Tex., 173–177 (1992).

Plasma Display Manufactures of the American Display Consortium, "Recommended Research Topics on Plasma Display for the DARPA Sponsored Phosphor Center of Excellence," 1–2 (1993).

Y. Yamamoto et al., "Optical Processes in Microcavities," Physics Today, 66–73, Jun. 1993.

E.F. Schubert, et al., "Giant Enhancement of Luminescence Intensity in Er–doped Si/SIO$_2$ Resonant Cavities," Appl. Phys. Lett. vol. 61 (12) pp. 1381–1383, 21 Sep. 1992.

H. Yokoyama, "Physics and Device Applications of Optical Microcavities," Science, vol. 256, 66–70, 3 Apr. 1992.

S. Haroche et al., "Cavity Quantum Electrodynamics," Scientific American, 54–62, Apr. (1993).

S.W. Depp, et al., "Flat Panel Displays," Scientific American, 90–97, Mar. 1993.

D.T.C. Huo et al., "Reticulated Single–Crystal Luminescent Screen," J. Electrochem. Soc., vol. 133, No. 7 (1986).

E.A. Hinds, "Spectroscopy of Atoms in a Micron–Sized Cavity," (date and periodical title unknown), 18–19.

*Primary Examiner*—Ashok Patel
*Attorney, Agent, or Firm*—Fliesler, Dubb, Meyer & Lovejoy

[57] ABSTRACT

A resonant microcavity display (20) having microcavity with a substrate (25), a phosphor active region (50) and front and rear reflectors (30 and 60). The front and rear reflectors may be spaced to create either a standing or traveling electromagnetic wave to enhance the efficiency of the light transmission.

8 Claims, 16 Drawing Sheets

RESONANT MICROCAVITY DISPLAY

BACKGROUND OF THE INVENTION

1. Field of the Invention

The present invention relates to a luminescent screen comprising a resonant microcavity having a phosphor active region.

2. Description of the Prior Art

Conventional cathode ray tube (CRT) displays use electrons emitted from an electron gun and accelerate them through an intense electric field projecting them onto a screen coated with a phosphor material in the form of a powder. The high-energy electrons excite luminescence centers in the phosphors which emit visible light uniformly in all directions. CRT's are well established in the prior art and are commonly found in television picture tubes, computer monitors and many other devices.

Displays using powder phosphors suffer from several significant limitations, including: low directional luminosity (i.e., brightness in one direction) relative to the power consumed; poor heat transfer and dissipation characteristics; and a limited selection of phosphor chromaticities (i, the colors of the light emanating from the excited phosphors).

The directional luminosity is an important feature of a display because the directional properties influence the efficiency with which it can be effectively coupled to other devices (e.g., lenses for projection CRT's). The normal light flux pattern observed from a luminescent screen closely follows a "Lambertian distribution"; i.e., light is emitted uniformly in all directions. For direct viewing purposes this is desirable, as the picture can be seen from all viewing angles. However, for certain applications a Lambertian distribution of the light flux is inefficient. These applications include projection displays and the transferring of images to detectors for subsequent image processing.

Heat transfer and dissipation characteristics are important because one of the limiting factors in obtaining bright CRT's suitable for large screen projection is the heating of the phosphor screen. As the incident electron beam density increases, the phosphor temperature increases. When the phosphor reaches a certain temperature, its luminosity decreases. This is known as thermal quenching. With conventional powder-phosphor displays the phosphor-to-screen heat transfer characteristics are relatively poor, therefore heat dissipation is limited and thermal quenching can occur at relatively low electron beam densities. Because projection displays require high electron beam densities to produce the brightness required to project an image, this inefficiency makes conventional CRT's poorly suited for projection displays.

Chromaticity is important because the faithful reproduction of colors in a display requires that the three primary-color phosphors (red, green and blue) conform to industry chromaticity standards (e.g., European Broadcasting Union specifications). Finding phosphors for each of the three primary colors that exactly match these specifications is one of the most troublesome aspects of phosphor development.

The decay time of the activator (i.e., light emitting ion in the phosphor) is also another important parameter for a phosphor. In an ideal phosphor for high brightness applications, it is desirable to control directly the decay time of the phosphor for each display application. For example, in some applications, shorter decay times allow rapid re-excitation of the activator with a corresponding increase in the maximum light output. The decay time is typically determined by the natural spontaneous transition rate of the activator. In order to improve phosphor performance it is therefore desirable to have control over this spontaneous transition rate.

Another problem encountered in conventional phosphor displays is that energy can transfer from one activator to another nearby activator in the phosphor host matrix. This is a nonradiative process where the efficiency of the phosphor is reduced. The energy transfer increases with increasing activator concentration and therefore it limits the density of activators that can be incorporated in a display and thus the maximum light output.

The use of a single-crystal, thin-film phosphor as a faceplate for a CRT was first described in a British patent application by M. W. Van Tol, et al., UK Pat. GB-2000173A (1980). This patent taught the use of an yttrium aluminum garnet $Y_3Al_5O_{12}$ (YAG) film grown by liquid phase epitaxy (LPE) on a single-crystal YAG substrate. The YAG film is doped with a rare-earth ion which emits light when excited by electrons. (Doping is the process wherein dopant ions are substituted for host ions in the crystal lattice during crystal growth.) In this device, the thickness of the thin-film layer is from one to six microns and does not bear any relation to the wavelength of the light to be emitted by the display.

This device exhibited several advantages over conventional powder-phosphor displays. One such advantage was that heat was transferred from the phosphor more efficiently because of the perfect contact between the phosphor and the screen, and because of the high thermal conductivity of the YAG substrate. The screen could be loaded with a higher beam density without exhibiting thermal quenching and, therefore, could produce more light.

Another advantage of single-crystal phosphor luminescent screens versus powder deposited luminescent screens is concerned with the resolution of a pixel (i.e., light producing spot). For high resolution displays using powder phosphor, the limiting size of a pixel—and hence the resolution of the screen—is determined by the particle size of the phosphor powder. Single-crystal phosphors, on the other hand, are not affected by this since they do not contain discrete particles.

Powder phosphors further reduce resolution due to the light scattering from the surface of the powder. Because of the lack of discrete phosphor particles and the absence of light scattering, thin-film displays have high image resolution, limited only by the spot size of the exciting electron beam. The increasing demand for higher resolution displays makes this a particularly attractive advantage.

Yet another advantage is concerned with producing a vacuum in a CRT. To allow the electron beam to travel between the electron gun and the phosphor screen, a vacuum must be maintained within a CRT. Conventional powder phosphors have a high total surface area and, generally, organic compounds are used in their deposition. Both the high surface area and the presence of residual organic compounds cause problems in holding and maintaining a good vacuum in the CRT. Using thin-film phosphors overcomes both of these effects, as the total external surface area of the tube is controlled by the area of the thin-film (which is much less than the surface area of a powder phosphor display) and, furthermore, there are no residual organic compounds present in thin-film displays to reduce the vacuum in the sealed tube.

The thin-film phosphors of Van Tol, et al., exhibit one prohibiting disadvantage, however, due to the phenomenon of "light piping." Light piping is the trapping of light within the thin-film, rendering it incapable of being emitted from the device. This is caused by the total internal reflection of the light rays generated within the thin-film. Since the index of refraction (n) of most phosphors is around n=2, only those light rays whose incident angles are less than the critical angle, $\theta_c$ (where $\sin \theta_c - 1/n$) will be emitted from the front of the thin-film. The critical angle for an n=2 material is around 30°. Therefore, the fraction of light that escapes from the front of the thin-film is only about 6.7% of the total light. The common design of placing a highly reflective aluminum layer behind the film only doubles the output to about 13% of the light. Moreover, this light is spread in a "Lambertian distribution" and is not directional. As a result of light piping, the external efficiency (i.e., the percentage of photons escaping from the display relative to all photons created in the display) is less than one-tenth that of powder phosphor displays. Therefore, in spite of the unique advantages offered in terms of thermal properties, resolution, and vacuum maintenance; the development of commercial CRT devices based on thin-films is held back by their poor efficiency due to "light piping".

Some schemes have been designed to reduce the "light piping" problem. One scheme described by Bongers, et al., U.S. Pat. No. 4,298,820 (1981), uses a thin-film, deposited by LPE, with V-shaped grooves etched into the surface to reflect light out of the thin-film. This approach brought about an improvement in external efficiency of around 1½ to 2½ times that of a thin-film display without the V-shaped grooves. Given the previous external efficiency of 13%, this would still only lead to a total external efficiency of around 20% to 30%.

Another scheme, described by Huo and Hou, "Reticulated Single-Crystal Luminescent Screen", 133 J. Electrochem. Soc. 1492 (1986), involves etching individual mesa shapes onto the thin-film deposited by LPE. This led to a three times improvement in external efficiency (still rendering only about a 30% external efficiency). Furthermore, since the phosphor layer was no longer smooth, any light rays that were internally reflected could find themselves rescattered to areas far from their point of creation, thus spoiling the resolution of the display.

Microcavity resonators, which can be incorporated in the present invention, have existed for some time and have recently been described by H. Yokoyama, "Physics and Device Applications of Optical Microcavities" 256 Science 66 (1992). Microcavities are one example of a general structure that has the unique ability to control the decay rate, the directional characteristics and the frequency characteristics of luminescence centers located within them. The changes in the optical behavior of the luminescence centers involve modification of the fundamental mechanisms of spontaneous and stimulated emission. Physically, such structures as microcavities are optical resonant cavities with dimensions ranging from less than one wavelength of light up to tens of wavelengths. These have been typically formed as one integrated structure using thin-film technology. Microcavities involving planar, as well as hemispherical, reflectors have been constructed for laser applications.

Resonant microcavities with semiconductor active layers, for example silicon or GaAs, have been developed as semiconductor lasers and as light-emitting diodes (LEDs).

E. F. Schubert, et al., "Giant Enhancement of Luminescence Intensity in Er-doped Si/SiO2 Resonant Microcavities" 61(12) Appl. Phys. Lett. 1381 (1992), describes a resonant microcavity with an Er doped $SiO_2$ active layer. This device emits radiation in the infrared region and is intended as a laser amplifier for fiber-optic communications.

The Schubert device, the semiconductor lasers and the LEDs are not as suitable for use in luminescent displays for several reasons. They contain luminescent materials such as Si, GaAs, etc., in the active region which are suitable as laser media, but which are typically inefficient emitters of visible light and require excitation by the injection of electrons. They also are designed with small planar surface areas that are inadequate for display purposes. Moreover, because of the design of these devices and the active materials used, they typically cannot be excited efficiently with electron bombardment, an electric field, or ultraviolet radiation. These excitation mechanisms are an essential part of the current display technologies.

Furthermore, the laser microcavity devices work above the laser threshold, with the result that their response is inherently nonlinear near this threshold and their brightness is limited to a narrow dynamic range. Displays, conversely, require a wide dynamic range of brightness. Microcavity lasers utilize stimulated emission and not spontaneous emission. As a result, these devices produce highly coherent light making these devices less suitable for use in displays. Highly coherent light exhibits a phenomenon called speckle. When viewed by the eye, highly coherent light appears as a pattern of alternating bright and dark regions of various sizes. To produce clear, images, luminescent displays must produce incoherent light.

In addition, it is important to distinguish the resonant microcavity display from the laser CRT. This display is similar to a CRT and scans an electron beam to write the information to the luminescent screen. However, the light is not produced by the spontaneous emission of the phosphor, but by stimulated emission. The faceplate of the laser CRT is an electron beam pumped semiconductor laser. The active medium, a semiconductor, is placed between two mirrors that form a laser cavity. The cavity structure is contained within the faceplate. When pumped with a sufficiently energetic electron beam, the device lases, producing a highly energetic and directional light beam. Such a display is described by A. S. Nasibov, et. al. in the article "Full Color TV projector based on $A_2B_6$ electron-pumped semiconductor lasers", *J. Crystal Growth,* 117, 1040 (1992).

SUMMARY OF THE INVENTION

The subject invention, the Resonant Microcavity Display (RMD), is a luminescent display which offers the advantages of a thin-film phosphor without exhibiting the light piping problem. This is because it emits light in a highly directional manner as a result of its geometry.

The resonant microcavity display is any structure that modifies spontaneous emission properties of a phosphor contained within the structure. The modification of spontaneous emission is obtained by changing the optical mode amplitudes to the such a degree that the phosphor favorably emits into a relatively few optical modes. It is also possible to suppress emission in certain optical modes. This modification of mode amplitudes can be created, for example, by the formation of a standing wave electric field for each favored mode within the structure and locating the phosphor at the antinodes of these standing waves. It is essential that the standing waves have substantially modified electric field amplitudes relative to the the field amplitudes generated without a cavity. Substantially modified refers to changes by a factor of two or more in the field amplitudes.

In standing wave cavities, no enhancement can occur at the node of the electric field. However, a ring cavity design 320 such as that shown in the downward-looking view of FIG. 1 supports a traveling wave 322 in which the electric field amplitude is substantially modified throughout the entire cavity. As a result, mode enhancement or suppression can occur throughout the cavity. Compared to the standing wave cavity, more active medium 324 with modified light emission can be utilized for the same cavity volume.

One example of a resonant microcavity display is a microcavity resonator comprising a phosphor sandwiched between two reflectors, all of which are grown on a transparent rigid substrate. The width of the active region is chosen such that a resonant standing wave, of the wavelength to be emitted, is produced between the two reflectors. In its simplest form, a single coplanar microcavity, the two reflectors are parallel to each other and the plane of the active region is parallel to the reflectors. Other geometries which produce standing waves or traveling waves with an increased electric field amplitude, such as combinations of planar microcavities, three-dimensional microcavities, confocal microcavities, hemispherical microcavities, or ring cavities are also possible. These other geometries are well-known in the art of designing cavities.

Another structure that favorably alters the spontaneous emission properties uses photonic band gap crystals. A photonic band gap crystal can be formed from a monodispersed colloidal suspension. The structures comprise periodic dielectric media to create a band gap of energy for which light cannot propagate within the structure. However, doping such a structure with a material that has a resonance within the band gap will create a high Q cavity. Such cavities can be one, two or three dimensional. The cavity generates a standing wave with an enhanced electric field amplitude in the region of the dopant. In order to create a display, the photonic band gap crystals must be a phosphor. Henry O. Everitt describes photonic band gap crystals in "Applications of Photonic Band Gap Structures", *Optics & Photonics News*, 20, (1992). FIG. 2 is a side view of a resonant microcavity display 350 on a substrate 352 using a photonic band gap crystal 354 as the entire cavity structure.

Fabricating the RMD requires the use of a growth technique capable of controlling layer thickness or the spatial resolution of the refractive index to a precision of several nanometers. Such techniques, for example, include, but are not limited to, chemical vapor deposition (CVD), molecular beam epitaxy (MBE), atomic layer epitaxy (ALE), electron beam evaporation, or sputtering. Fabricating the RMD may also employ holographic photo-lithographic techniques. In this case, the Bragg reflectors are created by exposing a suitable material to a holographic pattern thereby creating in the material alternating layers of high and low refractive index regions. Such a technique is well known in the art of fabricating holographic diffraction gratings.

The substrate can be either a crystalline, polymer, or an amorphous solid. It can be made of any material that will allow the other regions to be grown on it. Suitable substrate materials may be chosen from a wide range of materials such as oxides, fluorides, aluminates, and silicates. The substrate material can also be fabricated using organic materials. The criteria involved in selecting a substrate material include its thermal conductivity and its compatibility (both physical and chemical) with other materials forming the RMD.

The phosphor may be excited through several means, including: bombardment by externally generated electrons (cathodoluminescence), excitation by electrodes placed across the active layer to create an electric field (electroluminescence), or excitation using photons (photoluminescence).

The present invention is distinguished from other microcavity devices in part by the placing of a phosphor in the resonant microcavity. Phosphors are materials that exhibit superior visible luminous efficiencies (where luminous efficiency, as used herein, is defined as the ratio of light output in Watts over the power input in Watts). Typically, the luminous efficiencies of phosphors range between 1% and 20%. These high efficiency materials are only classified as phosphors if the material efficiently generates luminescence when excited by electrons, electric fields, or light.

The active region may comprise a wide range of inorganic phosphors (e.g., sulfides, oxides, silicates, oxysulfides, and aluminates) most commonly activated with transition metals, rare earths or color centers. In addition to inorganic phosphors, the active region may employ an organic phosphor such as tris (8-hydroxyquinoline) aluminum complex. The active region comprises phosphors typically in the form of single crystal films, polycrystalline films, amorphous films, thin powder layers, liquids, or some combination of the above. A selection of phosphors that have found commercial applications, and from which an application dependent phosphor can typically be selected for use in the present invention, is documented in "Optical Characteristics of Cathode Ray Tube Screens," Electronic Industries Association Publication TEP 116.

The reflectors forming the resonant cavity consist of either metallic layers or Bragg reflectors. Bragg reflectors are dielectric reflectors formed from alternating layers of materials with differing indices of refraction. The simplest geometry for dielectric reflectors consists of one-quarter wavelength thick layers of a low refractive index material, such as a fluoride or certain oxides, alternating with one-quarter wavelength thick layers of a high refractive index material, such as a sulfide, selenide, nitride, or certain oxides. The dielectric reflectors can also be fabricated using organic materials. Mirrors can also be formed using photonic band gap crystals. Any incident light with an energy within the band gap will be reflected by the structure. FIG. 3 shows a side view of an illustrative embodiment of a resonant microcavity display 340 on a substrate 342 in which an active layer 346 is sandwiched between two mirrors 344, 348 comprising photonic band gap crystals.

In current display applications, only one side of the screen is viewed. In the case of a microcavity, the design requires the use of different reflectors in order for most of the light to be projected towards the viewer. In the case of the simple coplanar microcavity, this asymmetry is obtained by having one of the two reflectors be substantially wholly reflective, meaning that it reflects most of the light impinging on it. The other reflector (opposite to the substantially wholly-reflective reflector) is partially reflective, meaning that it does not reflect as high of a percentage of impinging light as the wholly-reflective reflector and allows some of the light to pass through it. Because of the difference in reflectance of the two reflectors, virtually all of the light produced in the active region escapes through the partially-reflective reflector along the axis normal to the plane of the device.

In the case of a microcavity structure, the dimensions depend on the natural spontaneous emission spectrum of the phosphor being used, as observed outside of a cavity. If the spectrum covers a broad range of visible wavelengths it is possible to choose an appropriate part of the spectrum a (i.e., one that matches an industry standard chromaticity) and construct the microcavity with a matching resonance. The final chromaticity of the RMD will correspond to the cavity resonance and will be different from the natural chromaticity of the phosphor outside of the microcavity. Conversely, if the phosphor's natural spontaneous emission spectrum covers only a narrow range of visible wavelengths, the dimensions would be chosen so that the cavity resonance would match one of the phosphor's emission bands.

The RMD has a highly directional light output similar to those of a projector or a flashlight and, as a result, RMDs can be constructed to avoid light piping. This allows highly efficient coupling to other devices. RMD's also have a high external efficiency, approaching 100%. Since RMDs incorporate films, RMDs permit the design of efficient thermal conduction of the heat generated in the active layer. This feature combined with the ability to reduce the phosphor decay time allow RMDs to utilize intense excitation. As a result of the above, RMDs are especially suitable for use in projection displays.

It is therefore an object of this invention to provide a luminescent display that does not exhibit the problem of light piping.

It is a further object of this invention to provide a luminescent display with highly efficient heat transfer properties.

It is a further object of this invention to provide a luminescent display with a high external efficiency.

It is a further object of this invention to provide a luminescent display capable of high resolution.

It is a further object of this invention to provide a luminescent display which produces a highly directional output.

It is a further object of this invention to provide a luminescent display in which the chromaticity of the emitted light can be accurately controlled irrespective of the nature of the phosphor used.

It is a further object of this invention to provide a luminescent display wherein the phosphor used can be chosen to optimize the display with respect to properties other than chromaticity.

It is a further object of this invention to provide a luminescent display wherein the decay time of the activator can be tailored for the specific display application.

It is a further object of this invention to provide a luminescent display which can be heavily loaded by the excitation source without saturating the phosphor due to overheating.

Other objects and advantages of the present invention will become apparent to those skilled in the art from the following detailed description of the illustrated embodiments, when read in light of the accompanying drawings.

Throughout this specification, published articles are cited for background purposes. These articles are hereby incorporated by reference into this specification.

BRIEF DESCRIPTION OF THE DRAWINGS

FIG. 13b is an illustration of a front view of an array of pixel-sized microcavities as used in a color television in accordance with the invention. The front view shown in FIG. 13b corresponds to a view from the top of FIG. 13a.

DETAILED DESCRIPTION OF THE INVENTION

The present invention employs quantum electrodynamic (QED) theory to enhance the properties of the light emitted from phosphor based luminescence displays. The performance of a given display application depends on properties of the emitted light such as the chromaticity, direction, and flux. These properties can be optimized by employing the principles of QED theory in the design of microcavities so as to control the spontaneous emission characteristics of the phosphor activator for each specific display application.

Figure 1:
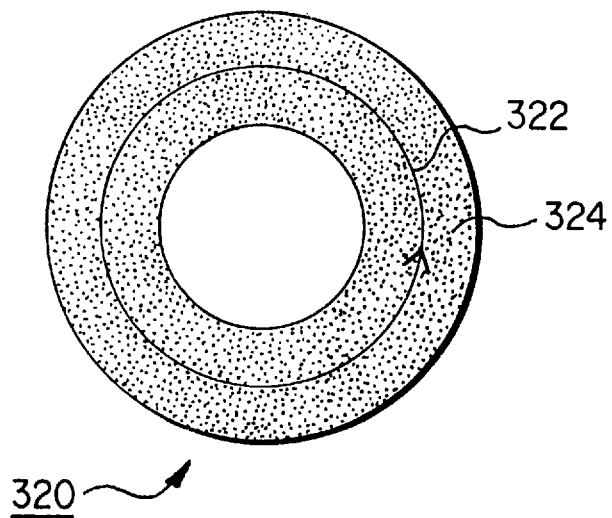
FIG. 1 is a top sectional view of a traveling wave cavity in one illustrative embodiment of a resonant microcavity display in accordance with the invention.
Figure 2:
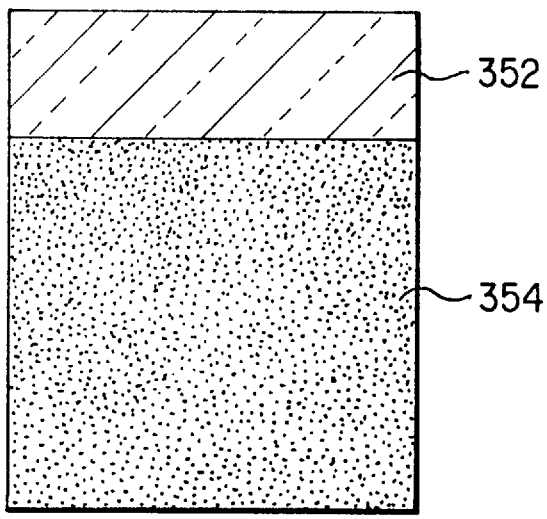
FIG. 2 is a side sectional view of an illustrative embodiment of a resonant microcavity display in accordance with the invention using a photonic band gap crystal as a resonant microcavity display.
Figure 3:
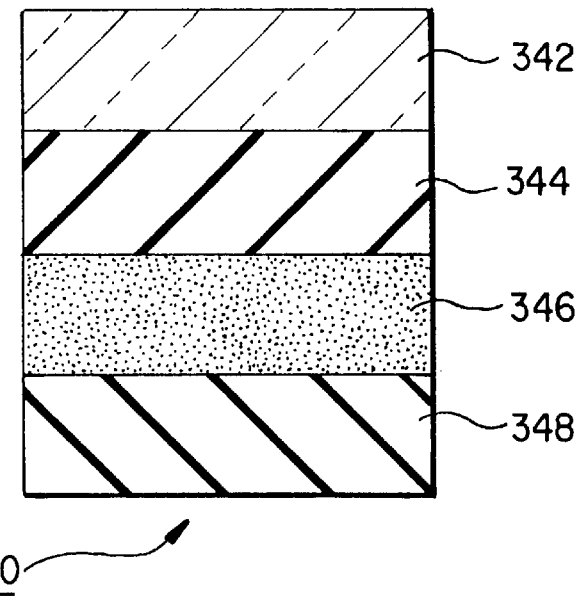
FIG. 3 is a side sectional view of an illustrative embodiment of a resonant microcavity display in accordance with the invention using photonic band gap crystals as mirrors.
Figure 4:
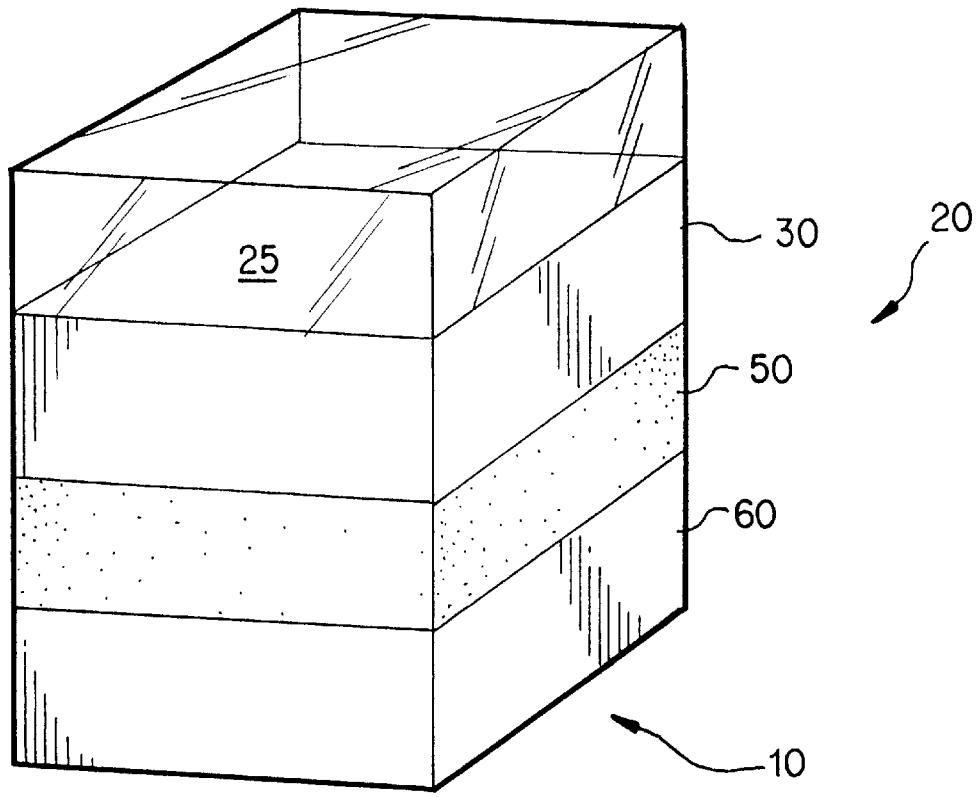
FIG. 4 is a perspective illustration of an illustrative embodiment of a resonant microcavity display in accordance with the invention employing a planar mirror resonator.
Figure 5:
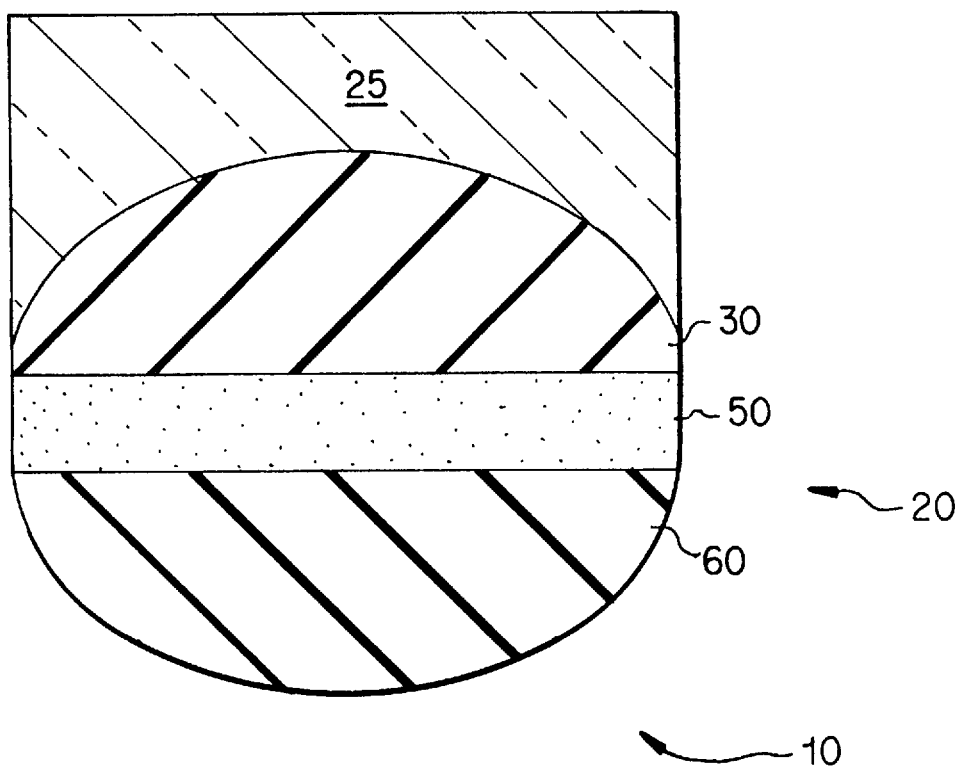
FIG. 5 is a side sectional view of an illustrative embodiment of a resonant microcavity display in accordance with the invention employing a confocal resonator.

As seen in FIG. 4, one example of the present invention 10 comprises a phosphor embedded in a resonant microcavity 20 grown on a substrate 25. The microcavity 20 further comprises a front reflector 30, a phosphor-based active region 50, and a back reflector 60. The active region 50 is disposed between two reflectors 30 and 60. The structure may comprise a variety of materials and may employ a variety of resonator designs. FIG. 4 illustrates a planar mirror design, whereas FIG. 5 illustrates the present invention configured in a confocal mirror design. The confocal design has the advantage of having an inherently higher cavity quality factor (Q).

More complex cavity designs involve stacking multiple microcavities. This design is similar to the standard method for forming interference devices which typically consist of 2 or more stacked cavities where each cavity is separated by a coupling layer. Such structures are used in the fabrication of, for example, bandpass optical filters, narrow band optical reflectors and long wavelength or short wavelength cutoff filters.

The invention can only be completely understood by employing quantum electrodynamic (QED) theory as applied to a cavity. Cavity QED calculations allow one to determine the following parameters for a given degree of activator excitation and activator concentration: the amount of light emitted from the microcavity; the angular spread of the light emitted; and the color of the light emitted.

The calculation begins by determining the nature of the electromagnetic field inside and outside of the cavity. This field calculation uses Maxwell's equations with the boundary conditions imposed by the microcavity. Applying Fourier analysis, the net electromagnetic field is broken down into its fundamental constituents, the optical modes.

An optical mode is a field with a characteristic frequency, direction and polarization. The square of the field intensity corresponds to the actual amount of light. One must select from this field distribution those optical modes that correspond to useful light. For a display, useful light is defined as any light emitted from the cavity within a certain predetermined angular spatial distribution and predetermined frequency spread.

The next step is to calculate the amount of light emitted by each activator. This calculation begins by determining the radiative decay rate of each activator for each possible optical mode. The radiative decay consists of a spontaneous emission rate and a stimulated emission rate. The resonant microcavity display, however, only operates satisfactorily as a display when there is no stimulated emission (i.e., constructing a microcavity to operate as a laser would preclude using it as a display). The degree of excitation, the type and concentration of the activators and the resonator design determines when stimulated emission is an issue.

The spontaneous emission rate is determined by using QED theory to calculate the probability that a single excited activator will decay into a specific optical mode. This calculation must use the field strength appropriate for the location of the activator in the cavity. The magnitude of the standing or traveling wave within the cavity may have different values throughout the phosphor layer. In addition, a certain probability exists that each excited activator will decay without emitting light. To calculate this non-radiative rate, one must consider cavity QED effects as they apply to the physical mechanism responsible for the non-radiative decay.

For a given excitation level, one can now calculate the amount of spontaneous emitted light for each activator. The ratio of the spontaneous rate to the sum of the radiative and non-radiative rates yields the percentage of excitation that will produce light. The amount of useful light is then determined by calculating the amount of the spontaneous emission in the desired optical modes. This calculation is performed for each activator. Finally, the sum of all the activator contributions yields the display intensity of the RMD.

The properties of the RMD that can be controlled include the chromaticity, the directionality of the display, the luminous efficiency and the maximum light output of the display. These properties are tuned according to the requirements of the specific luminescent screen application. The parameters that must be considered for optimization are the microcavity Q, the microcavity resonance frequency, the asymmetry of the reflectors, the resonator design (i.e., planar, confocal, multiple cavity, etc.), the phosphor, the thickness of the phosphor layer, the surface area of the microcavity and the excitation source. These parameters cannot be optimized separately; each affects the other adjustable properties of the display.

The performance of the resonant microcavity can be described by the Q of the cavity. The Q of the cavity is given by the microcavity center frequency divided by the linewidth of the microcavity resonance:

$$Q = \frac{\nu}{\Delta \nu}$$

where $\nu$ is the microcavity resonance frequency and $\Delta \nu$ is the linewidth of the cavity resonance. The cavity Q is determined primarily by the reflectance of the reflectors, the resonator design, the asymmetry in the reflectance and any imperfections in the cavity. These imperfections typically result from defects in the structure of the resonant microcavity which scatter light out of the cavity in a non-useful manner. The Q can be measured empirically using an optical spectrometer.

As the cavity Q increases, the display brightness and efficiency increases. In addition, the angular spread of the light decreases and the linewidth shrinks altering the chromaticity. Note that as the spatial distribution of the light narrows, the amount of light in certain regions decreases. Depending on the display application, this effect may or may not be desirable. For the range of the current display applications, the engineered cavity Q will typically vary between 10 and 10,000. The above effects can be determined experimentally by measuring the light intensity as a function of solid angle for resonant microcavities with different Q values. Using this data, one can predict the required Q for a given application.

For most current applications, only one side of the luminescence screen is viewed. In these applications one should choose reflectors with different reflectivities such that the display preferentially forces the light out the cavity towards the viewer.

The resonator design directly affects the Q and mode volume. The latter term describes the actual volume of the activator layer that is participating in producing useful light. This volume is related to the spatial distribution of the electromagnetic field within the activator layer. The design of the resonator will also determine the spatial distribution of useful light. Due to the relatively straightforward construction, the simplest design is a planar resonator. However, other resonator structures which produce standing waves or traveling waves with an enhanced electric field intensity in a phosphor material may be useful. In particular, multiple planar microcavities may be combined to allow for a larger active region or to achieve greater control over the allowed emission than can be achieved with a single cavity.

Figure 6:
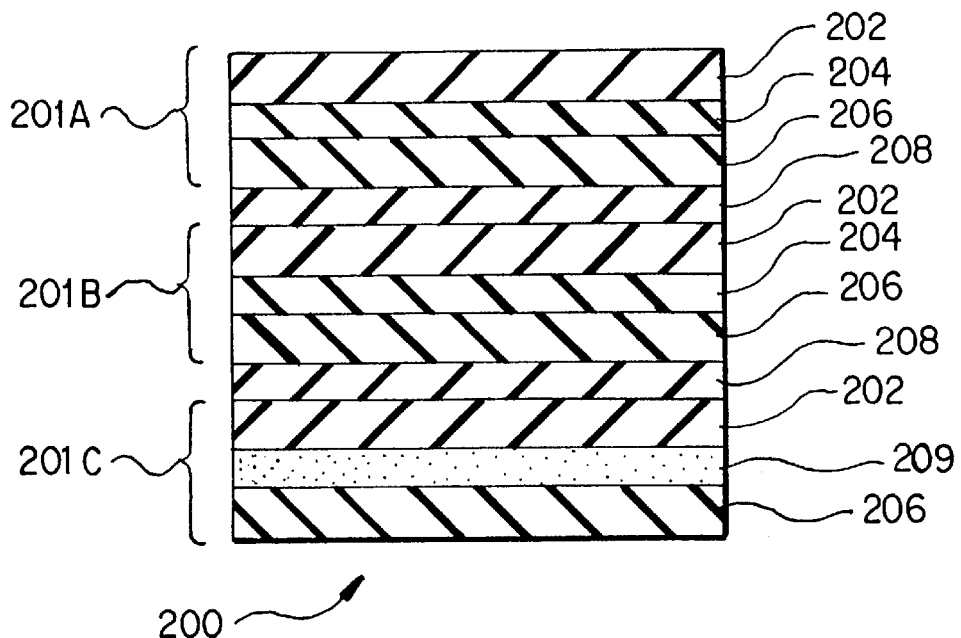
FIG. 6 is a side sectional view of an illustrative embodiment of a resonant microcavity display in accordance with the invention using multiple cavity structures.

FIG. 6 provides one illustrative design for a 3 cavity resonant microcavity 200. In this example, each cavity 201A, 201B, 201C comprises dielectric reflectors 202, 206. The dielectric reflectors 202, 206 are separated by a half-wavelength coupling layer 204 in cavities 201A and 201B, while adjacent cavities are separated from each other by a half-wavelength spacer 208. The phosphor material 209 is also a half-wavelength thick and is located within the lowest cavity, taking the place of a half-wavelength coupling layer in cavity 201C. The distances specified are optical thicknesses, i.e. the index of refraction multiplied by the physical thickness of the layer.

As already discussed in the case of the planar geometry, there exists an entire set of parameters to consider including the individual mirror reflectances and individual cavity Q's. In addition, one must also determine the cavity spacing, coupling layer, and the location of the phosphor material. The exact specifications will depend on the specific display requirements.

A primary design specification of the RMD is the chromaticity of the emitted light. The center frequency and linewidth of the cavity must be engineered so that the RMD displays this color of light.

Once these parameters are selected, the phosphor must be selected. The phosphor will need to have a natural luminescence resonance that overlaps the cavity resonance. As the resonance narrows and the overlap increases, the display efficiency and brightness increase. A compromise between chromaticity and other parameters may be required to optimize a display for a specific application.

The intensity of light emitted by the phosphor is related to the activator concentration: as the concentration increases, the intensity of emitted light increases. The activator concentration, however, is often limited by non-radiative energy transfer between activators that quenches luminescence. These quenching effects are concentration dependent. The quenching concentration varies from phosphor to phosphor, depending on the magnitude of various energy transfer parameters between activators. Cavity QED theory predicts that there is an effect on these parameters since they relate to spontaneous emission characteristics. Thus, another potential advantage of the RMD is that energy transfer between activators may be suppressed and phosphors could contain higher concentrations of activators than was previously possible, without losing efficiency. In addition, phosphors can simultaneously emit several wavelengths corresponding to different optical transitions within the material. However, only one of these transitions typically generates the useful light of the display. A microcavity can be designed to enhance this useful transition while inhibiting the non-useful transition(s). This suppression will increase the efficiency of the display. The ability of a structure to inhibit spontaneous emission and energy transfer processes has been described by G. Kurizki and A. Z. Genack in "Suppression of Molecular Interactions in Periodic Dielectric Structures", *Phy. Rev. Let.* 61, 2269 (1988).

The display properties also depend upon the thickness of the active region. Depending on the cavity design, there may be several active region thicknesses that produce a predetermined frequency. The range of thickness depends on the mirror construction. As the thickness increases, the number of potentially excited activators increases. With sufficient excitation energy, the total luminescence can be increased with a wider active region. However, the thickness may alter the spatial distribution in a highly complex manner. In the case of a simple coplanar microcavity, the angular spread of the light changes, with additional regions of high intensity appearing at angles that are not normal to the plane of the microcavity. More complex multiple cavity designs allow a greater degree of control over the directionality of the display.

Another key parameter in the resonant microcavity design is the area of the emitting surface. Some applications will require one large-area surface for the production of monochromatic light, while other designs will need pixel-sized cavities capable of producing red, green and blue light. The size of the pixel will be determined by the resolution requirements of the display.

One other important parameter is the excitation source and intensity. The display application will dictate the excitation source. The decision process in selecting the phosphor must also consider the efficiency of converting the excitation energy into useful luminescence. This efficiency is well documented for the registered phosphors, but can easily be experimentally determined. The intensity of the source will primarily change the brightness.

It should be noted that in considering the above design parameters, the light properties of the display must not reach the degree of coherence associated with a laser. To avoid this problem, particular attention must be paid to the cavity Q, the activator concentration and the excitation intensity.

Figure 7:
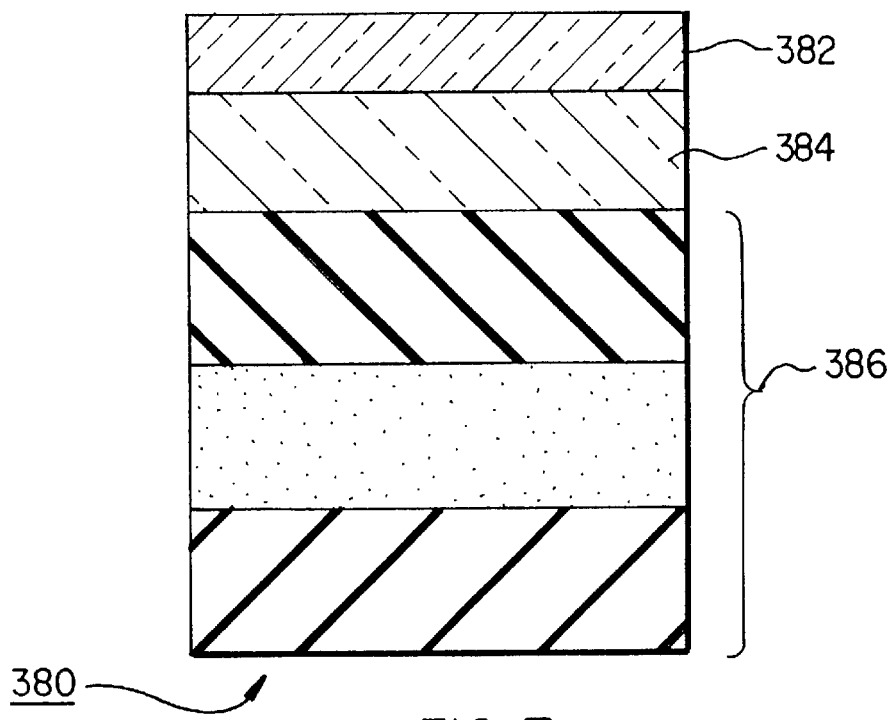
FIG. 7 is a side sectional view of an illustrative embodiment of a resonant microcavity display in accordance with the invention incorporating an integral optical element.

The RMD design lends itself to the incorporation of an optical element 382, such as a lens or a diffuser, fabricated within or on top of the substrate 384 of a resonant microcavity 386, as shown in FIG. 7. For example, a lens would be useful to modify the angular distribution of the light output produced by the structure and thereby generate the required distribution. The lens may be formed using photo-etching methods, which is well known in the art of miniature semiconductor lasers. Another method would employ the controlled placement of impurities to change the local refractive index. This method is used to construct gradient refractive index lenses which are commonly used in fiber optics.

Using such a lens adds another parameter that must be considered in the optimization of the display. However, such a lens enables one to maximize the output of the resonant microcavity without having to consider the required light distribution. For example, such a lens would eliminate or reduce the demands for the complex lens design currently required in the projection CRT display applications.

Similarly, a diffuser can be used to precisely control the angular spread of the light and thereby the field of view of the display. With the ability to control the light distribution independent of the microcavity, the spontaneous emission properties of the phosphor can be maximized without having to consider the required light distribution. A diffuser can be made using holographic techniques, ruled grating techniquess, introduction of internal scattering centers, or precisely controlled surface roughening.

The RMD can be embodied using cathodoluminescence which results from an electron beam bombardment of the phosphor. One example of a device which employs cathodoluminescence is a projection television. This application requires the highest intensities possible because it requires a wide viewing area and uses a light dispersing screen. In this application, the resonant microcavity display is incorporated in a CRT.

Full color projection televisions require three separate CRT's: one for each primary color. In this application, the RMD is superior to conventional methods because it allows intense excitation loading of the phosphor, highly directional output, controlled chromaticity, and high external efficiency. Therefore the RMD allows the use of relatively compact CRT's while maintaining high luminescence.

In the case of a resonant microcavity display incorporated in a CRT, the phosphor is excited by electrons emitted from the electron gun, accelerated to a speed such that most of them will penetrate the resonant microcavity to the depth of the phosphor. The high energy electrons excite electrons in the phosphor from the valence band into the conduction band. This additional energy is trapped at the impurity. The impurity then relaxes by emitting visible light.

In the case of a simple coplanar microcavity, the reflectors can be either dielectric or metallic. The back reflector has a higher reflectivity than the front reflector, so that light, emitted by the phosphor, exits the cavity through the front reflector, perpendicular to the plane of the thin film device. The microcavity Q and the asymmetry in the reflectance determines the percentage of light that exits the resonator through the front reflector.

In the case of the simple coplanar microcavity, the width of the active region affects the directionality of the light and is chosen so that its optical path length, i.e. the product of the distance between the back reflector and the front reflector and the index of refraction of the phosphor material, equals an integer multiple of the desired wavelength divided by 2 or 4 depending on the index of the adjacent layers. These dimensions ensure that a standing wave builds up between the back-reflector and the front reflector. The wavelength of the emitted light is determined by the resonant wavelength of the microcavity.

A dielectric, or Bragg, reflector consists of alternating layers of material with high and low indices of refraction. The number of layers determines the reflectivity of the reflector. The reflectivity (R) of the reflectors can be calculated using the following equation:

$$R = \frac{1 - \left(\frac{n_H}{n_L}\right)^{N-1} \times \frac{n_H^2}{n_S}}{1 + \left(\frac{n_H}{n_L}\right)^{N-1} \times \frac{n_H^2}{n_S}}$$

where $n_H$ and $n_L$ are the refractive index of the high and low index of refraction materials, respectively; $n_S$ is the index of refraction of the substrate and N is the total number of layers in the stack. This equation is valid for normal incidence. The width of each layer is equal to an odd integer multiplied by the desired wavelength of light to be emitted divided by the quantity 4 times the index of refraction of the material used in the layer. An alternate design uses holographic techniques to form the reflectors. In this case, the mirror is formed from one material with a continuously varying refractive index. Photo-lithography would be used to fabricate the mirrors.

The Q of the cavity can be calculated once the reflectivity is determined for the reflectors. In the case of the simple coplanar microcavity, the equation that relates Q to reflectivity is given by:

$$Q = \frac{2\pi n \nu}{c\left(\alpha - \frac{1}{l}\left(\ln\sqrt{R_1 R_2}\right)\right)}$$

where $\nu$ is the microcavity resonance frequency, n is the index of refraction of the phosphor, $\alpha$ is the average distributed loss constant, l is the width of the activator layer, $R_1$ is the reflectance of the front mirror and $R_2$ is the reflectance of the back mirror. The constant $\alpha$ is needed to account for the non-ideal behavior of the cavity that results from imperfections and spurious absorption.

The parameters chosen to optimize this display depend on the required brightness of the display and the required directionality of the light output. In the typical projection television application, the display should be highly directional and bright. For each color, the cavity Q can be optimized empirically by measuring the total intensity emitted in the useful direction as a function of the electron beam current. This efficiency measurement is common in the television design art.

Figure 8:
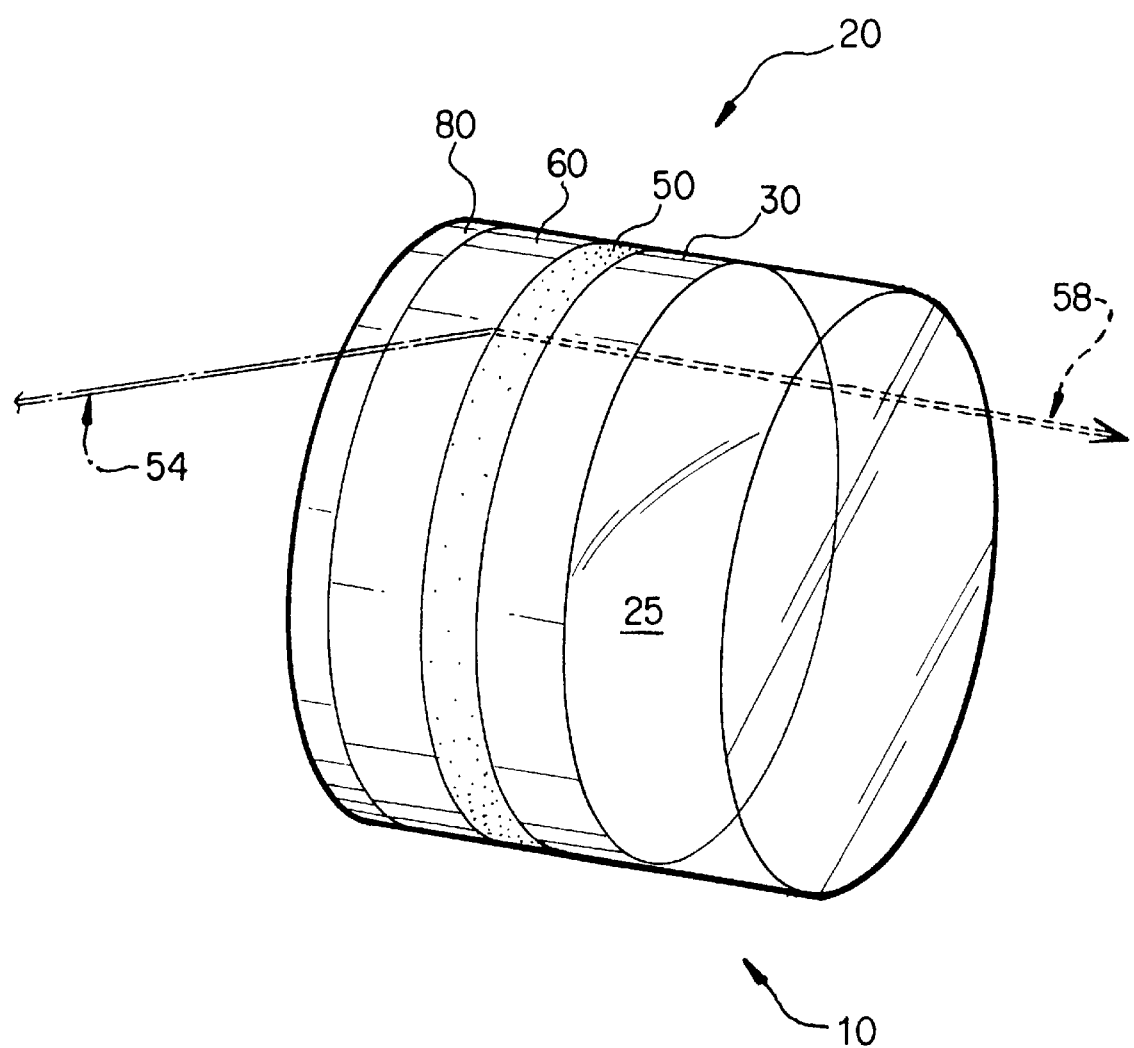
FIG. 8 is a perspective view of one illustrative embodiment of a resonant microcavity display in accordance with the invention employing cathodoluminescent excitation.

FIG. 8 shows one illustrative embodiment designed for cathodoluminescence, the simple planar resonant microcavity. The subject invention 10 comprises a resonant microcavity 20 grown on a rigid transparent substrate 2S. A layer of aluminum 80 is disposed next to the microcavity 20 to channel off electrons deposited by the electron beam and to provide an additional reflective surface. The resonant microcavity 20 is grown onto the substrate 25 using molecular beam epitaxy (MBE) or any suitable method of solid-state fabrication. Some methods of growth known to the art (e.g., LPE at its current level of development) are not suitable because they cannot be controlled with the precision necessary to grow a correctly sized microcavity. The active region 50 is excited by electrons from an electron beam 54 entering through the aluminum layer 80 and back reflector 60. The light 58 created in the active region exits through the front reflector 30 and the substrate 25.

Figure 9:
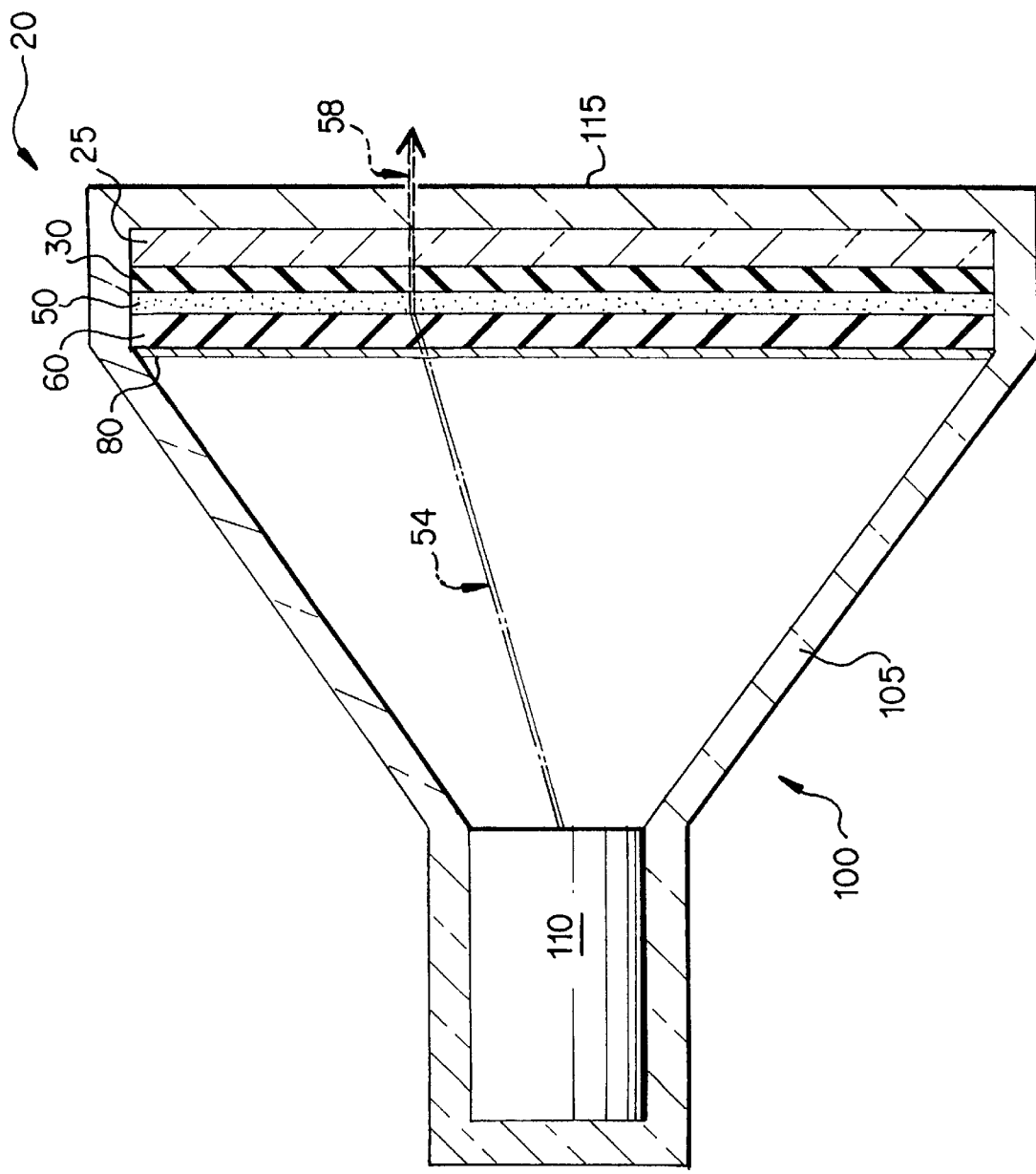
FIG. 9 is a side sectional view of an illustrative embodiment of a resonant microcavity display in accordance with the invention as it would be used in a cathode ray tube.

As seen in FIG. 9, this embodiment can be embodied in a cathode ray tube (CRT) 100 comprising a glass vacuum tube 105 enclosing an electron gun (which is a means to generate an electron beam) 110 aimed at a flat viewing surface 115 and distal from the electron gun 110; and a phosphor-based resonant microcavity 20 disposed parallel to the flat viewing surface 115 inside the vacuum tube 105. This embodiment is configured to produce monochromatic light.

Figure 10:
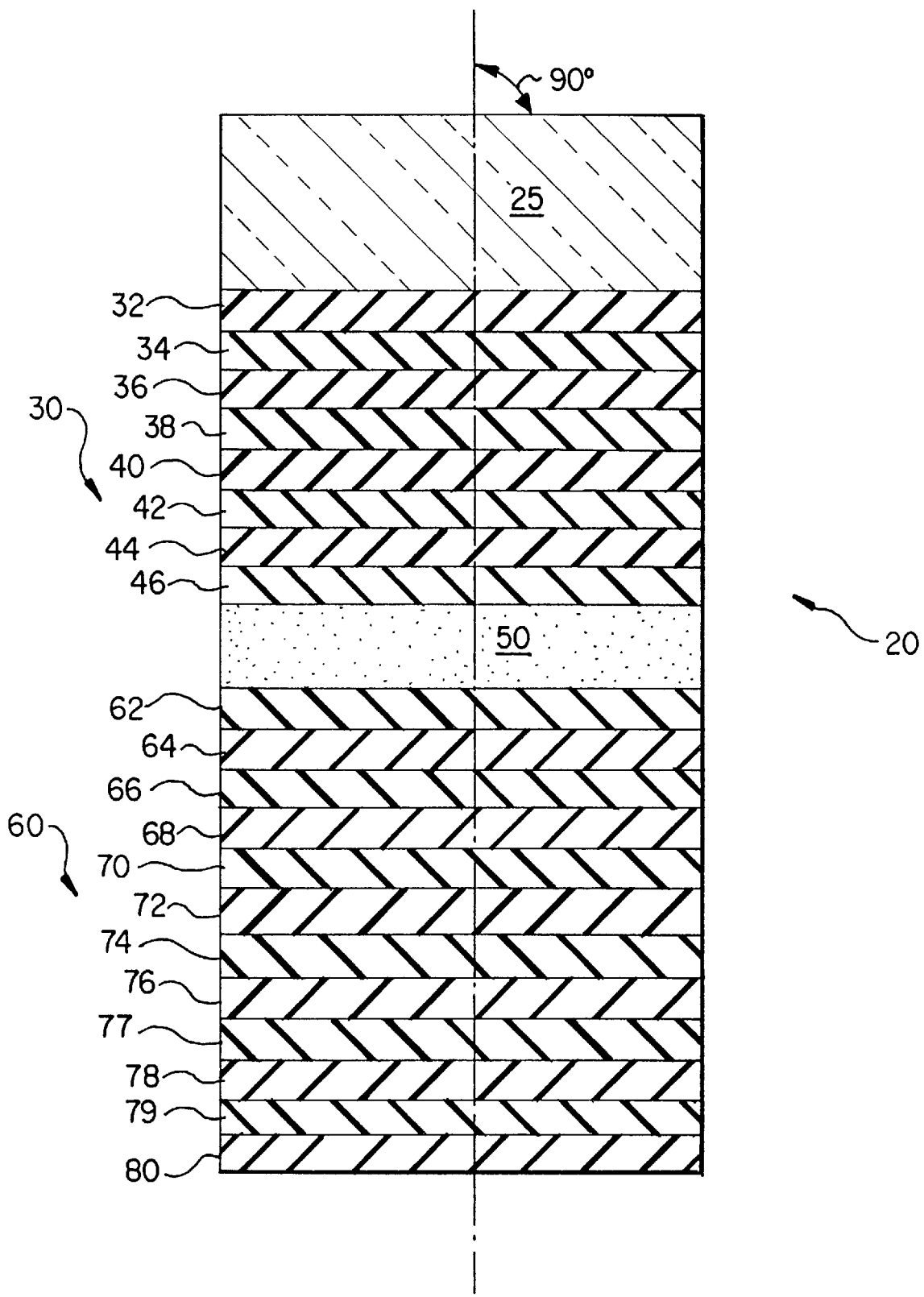
FIG. 10 is a side sectional view of an illustrative experimental embodiment of a resonant microcavity display in accordance with the invention designed to emit light through its front reflector with a wavelength of 530 nanometers.

As shown in FIG. 10, an experimental embodiment designed to emit light through the front reflector with a wavelength of 530 nanometers, the material used in the active region 50 is zinc sulfide (ZnS) doped with manganese (Mn) at a dopant concentration of 2%. The thickness of the active region 50 is 110 nanometers and the phosphor has an index of refraction of n=2.4.

In the front reflector 30, the material used in the layers with a relatively high index of refraction 32, 36, 40 and 44 is ZnS, and the material used in layers with a relatively low index of refraction 34, 38, 42 and 46 is calcium fluoride ($CaF_2$). In the back reflector 60, the material used in the layers with a relatively low index of refraction 62, 66, 70, 74, 77, and 79 is $CaF_2$, and the material used in the layers with a relatively high index of refraction 64, 68, 72, 76, and 78 is ZnS. All of the high-index ZnS layers are 55 nanometers thick with an index of refraction of n=2.4. All of the low-index $CaF_2$ layers are 95 nanometers thick with an index of refraction of n=1.4.

The substrate 25 is made of CaF$_2$. It is 2 millimeters thick and has an index of refraction of n=1.4. The aluminum layer 80 is 50 nanometers thick.

The microcavity 20 is grown on the substrate 25 using MBE and the aluminum layer 80 is deposited using vapor-phase deposition.

The front reflector has a reflectivity of R=97.5% with 8 layers and the back reflector has a reflectivity R=99.9% with 12 layers including the aluminum layer. Because the back reflector® is more reflective than the front mirror almost all of light produced in the cavity exits through the front reflector.

Figure 11:
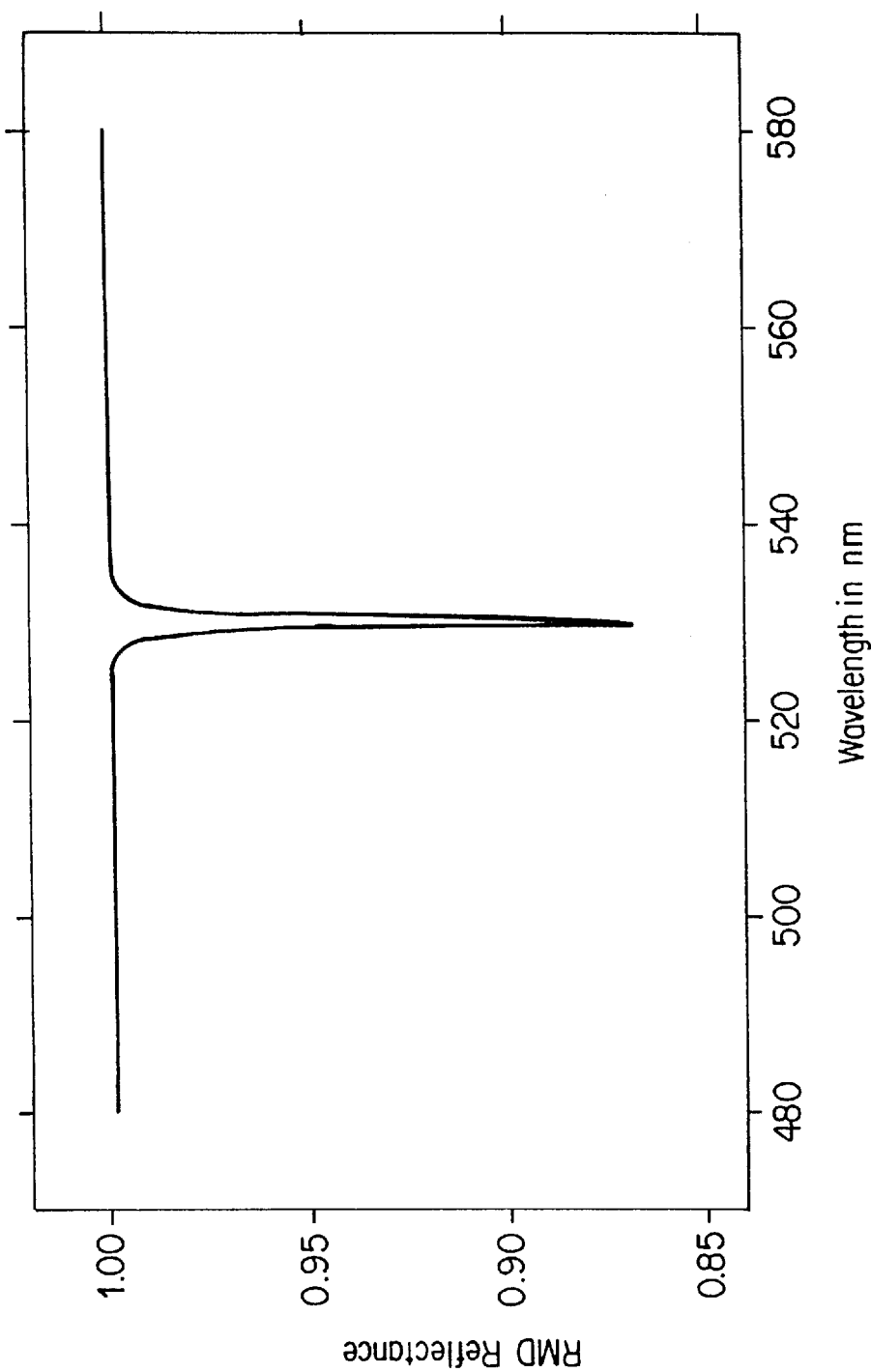
FIG. 11 is a graph relating the reflectance of the resonant microcavity display of FIG. 10 as a function of the wavelength of the incident light.

As shown in FIG. 11, the reflectance of the RMD is a function of the wavelength of the incident light. At the resonance wavelength of 530 nm, the reflectance dips to roughly 86%—indicating that the RMD will transmit this wavelength. At all other wavelengths the reflectance is near 100%—indicating that the RMD will not transmit light at non-resonance wavelengths. This reflectance behavior is due to the fact that the cavity can only support a standing wave of a wavelength equal to the resonance wavelength of the cavity.

Figure 12:
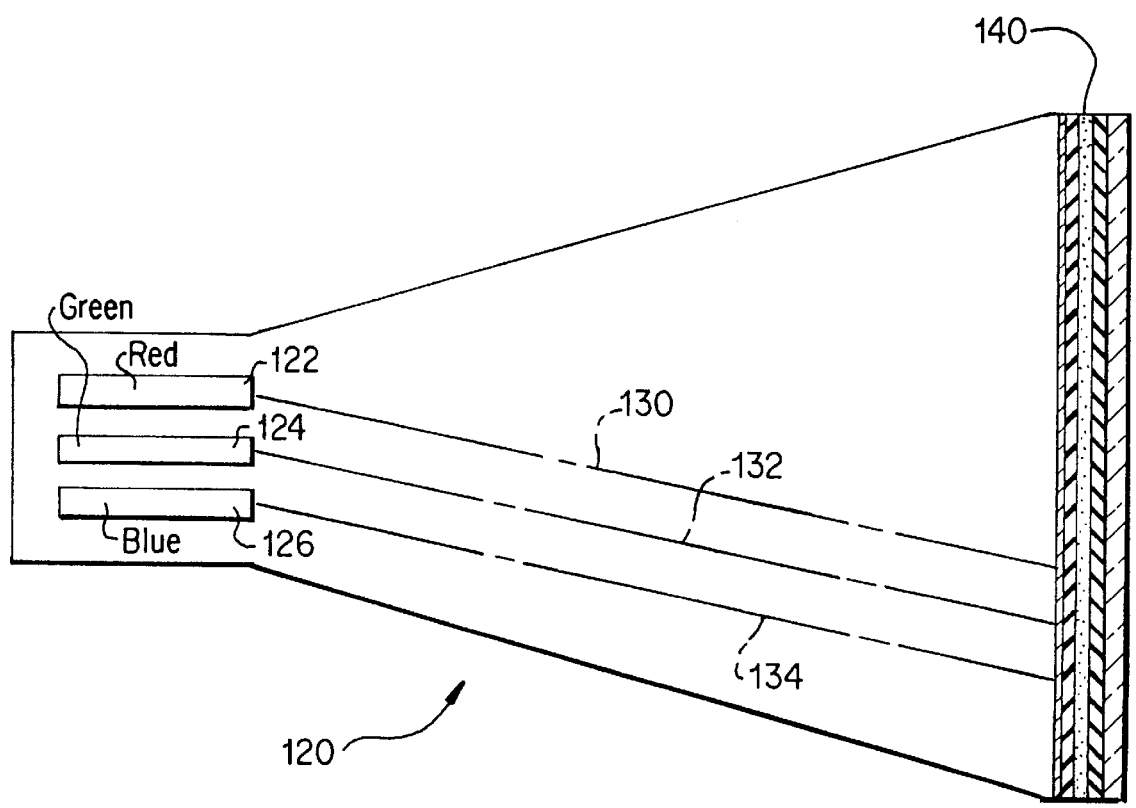
FIG. 12 is a side sectional view of a direct view color television employing a resonant microcavity display in accordance with the invention.

In another embodiment, the RMD can be used in a CRT as a direct view television. FIG. 12 depicts a direct view color television. The CRT 120 is similar to the one described in the projection television embodiment, except that it has three electron guns, 122, 124 and 126 one for each primary color. Each of the electron guns produces a separate electron beam, 130, 132 and 134, corresponding to the desired intensity of each color. The electron beams excite a screen 140 on the viewing surface of the CRT.

Figure 13B:
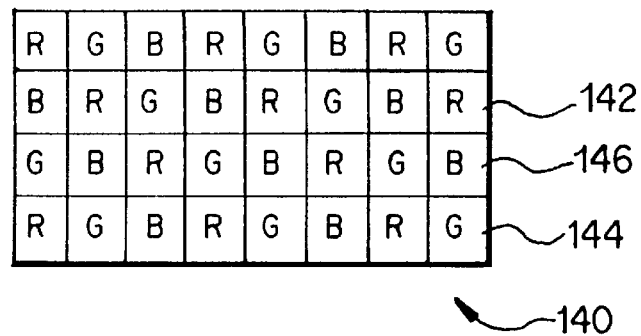
Figure 13A:
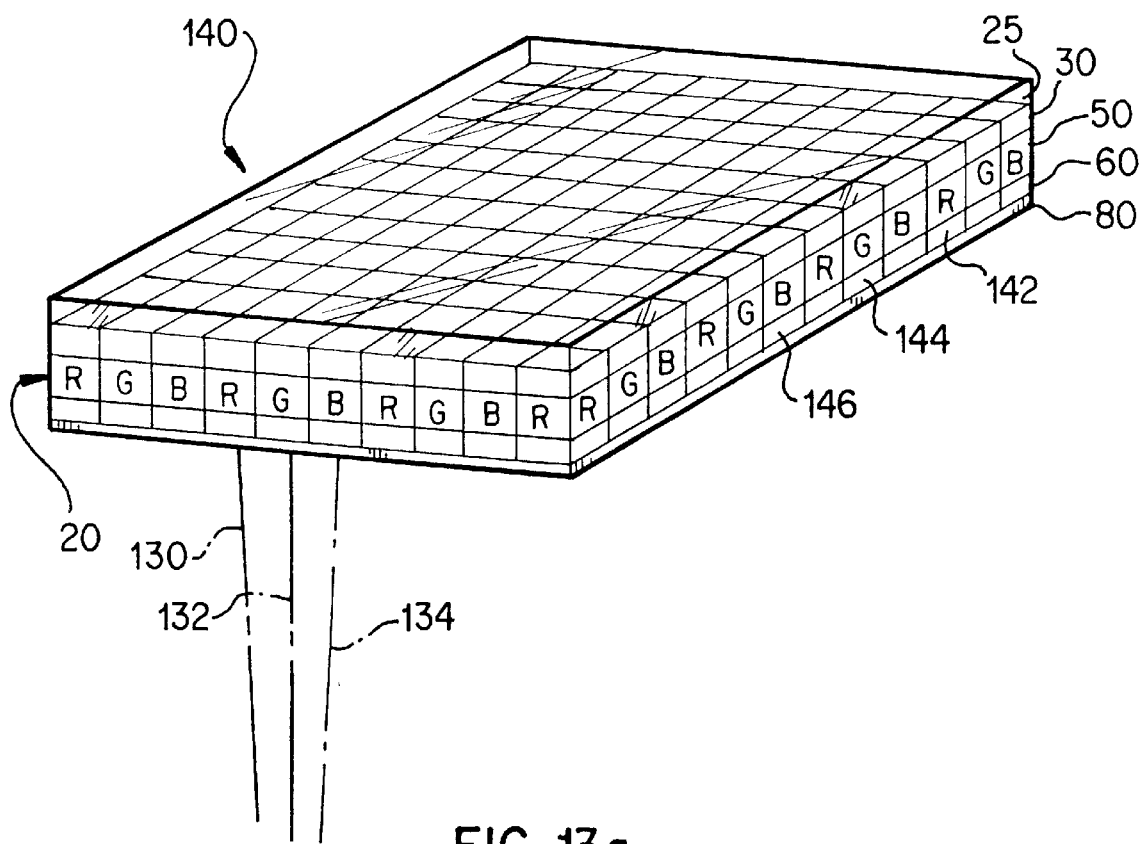
FIG. 13a is a perspective illustration of an array of pixel-sized microcavities as used in a color television in accordance with the invention.

As seen in FIG. 13a, the screen 140 comprises of an array of pixel-sized microcavities 20. The array contains microcavities designed to produce red light 142, green light 144 and blue light 146. The red-light pixels are excited by the "red" electron beam 130, the green-light pixels are excited by the "green" electron beam 132, and the blue-light pixels are excited by the "blue" electron beam 134. FIG. 13b shows a front view of the array of pixels and the arrangement of colors. The design of color displays with separate color pixels is well known in the art.

In this embodiment, the light emanating from the pixel produces the required angular distribution. One could also envision an embodiment in which a lens is used to achieve this display requirement allowing for the maximum efficiency to be produced by the resonant microcavity. The required angular distribution can also be obtained using a diffuser such as a holographic optical element.

The construction of the pixel is fundamentally the same as that described in the embodiment for a projection television. The primary difference is the size of the surface area and the angular spread of light required. In this case, the surface area is determined not by brightness, but by the resolution required by the application. High definition television, medical and military applications typically require the pixel size to be smaller than 25 microns. This requirement is difficult to achieve using current technologies, but can be easily achieved using an RMD.

With the resolution and angular distribution specified, the resonant microcavity display must be optimized for each color. This optimization will use the above-described empirical method of measuring the total light produced versus beam current. The restrictions of the design due to the specification mean that obtaining the maximum light output is primarily a function of the phosphor activator. In the embodiment in which a lens is placed outside the cavity, one has much more freedom in engineering the cavity. Without the restriction on the angular distribution, the cavity Q can be easily tailored.

Figure 14:
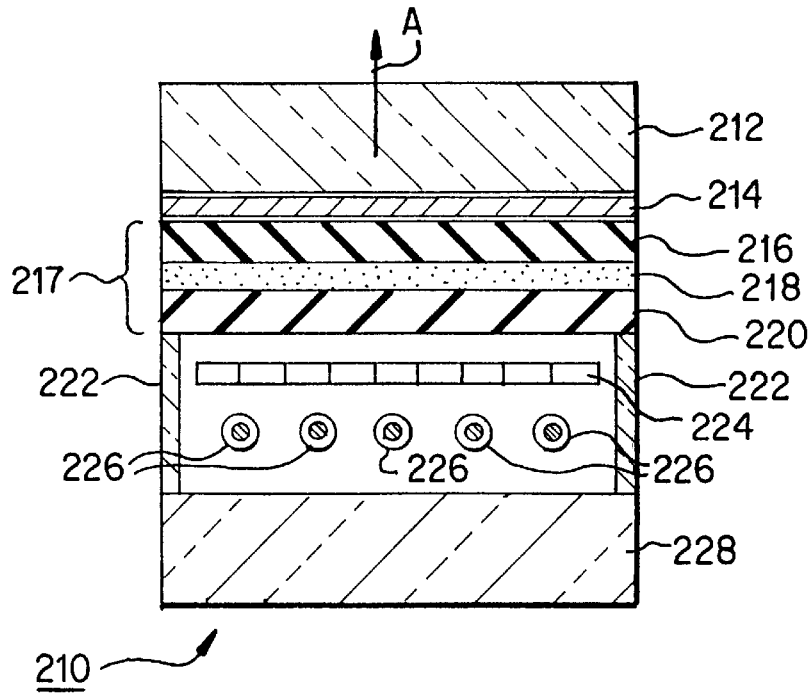
FIG. 14 is a side sectional view of an illustrative embodiment of a resonant microcavity display in accordance with the invention incorporated in a vacuum fluorescent display.

In another embodiment using electrons that excite the active layer, the resonant microcavity 217 can be incorporated in a vacuum fluorescent display 210, as shown in FIG. 14. Display 210 comprises individual pixels which are typically combined to form low resolution, compact information displays and extremely large displays.

A vacuum fluorescent display generally comprises an array of cathodes 226, a control grid 224 and phosphor coated anodes, corresponding to anodes such as anode 214 shown in FIG. 14. (Anode 214 shown in FIG. 14 differs from a conventional anode as described below.) Electrons are first generated by the hot filaments that form the cathode array 226. A positive voltage is applied between the cathode array 226 and anodes 214. When the control grid voltage is on, the electrons are accelerated by the positive potential towards the phosphor layer which is deposited, in a conventional vacuum fluorescent display, on top of the anodes. The remainder of the display conventionally comprises a glass faceplate 212, glass backplate 228, and a glass frit seal 222, containing a vacuum for the control wire grid 224 and filament cathodes 226.

A resonant microcavity structure may be used to improve the performance of this type of display. One possible illustrative embodiment is depicted in FIG. 14. The resonant microcavity structure 217 comprising an active layer 218 sandwiched between a pair of dielectric mirrors 216, 220 disposed between the control wire grid 224 and the anode 214 replaces the powder phosphor that is conventionally deposited on anodes such as anode 214.

For small scale monochromatic displays, one resonant microcavity 217 would be used and the pixels would be determined by the control grid 224 and cathode 226 arrangement. If full color is required, a resonant microcavity 217 would be required for each primary color. An efficient layout would comprise alternating stripes of microcavities 217 with separate stripes for each color. In large screen applications, each pixel would incorporate one resonant microcavity designed for a specific color. The array would then comprise a triad of red, green and blue pixels.

As discussed above for the two CRT embodiments, the parameters such as directionality, brightness, color and the microcavity structure apply for the vacuum fluorescent display. The design considerations and methodology required for optimizing the display are also the same. For example, since this display is a direct view type, with light emission directed towards a viewer in the direction indicated by arrow A, the divergence of the emitted light would be tailored for the viewer distance and required viewing angle. Incorporation of lenses and diffusers must be considered. The design of vacuum fluorescent displays for specific applications is well known in the art.

In another embodiment using excitation by electrons, the resonant microcavity can be incorporated into field emission displays for both projection and direct view applications. This display operates on the principle of electrons tunneling from a microscopic tip or a microscopic region of a low work function material. The electrons are then accelerated via a positive potential and penetrate an adjacent phosphor layer. Typically there is a evacuated region between the tips and the phosphor, but in some applications the phosphor may be grown directly on top of the emitting surface.

These displays may operate in both a high voltage and low voltage mode. In the high voltage application, typically above 500 volts, an emitter array would be assembled behind each microcavity. The display could consist of one microcavity that is the size of an entire display to generate monochromatic light or the display could consist of pixel size microcavities suitable for producing color images. In these structures, the voltage must be sufficiently high that the electrons can pass through the bottom mirror of the RMD into the active layer to stimulate the phosphor.

Figure 15:
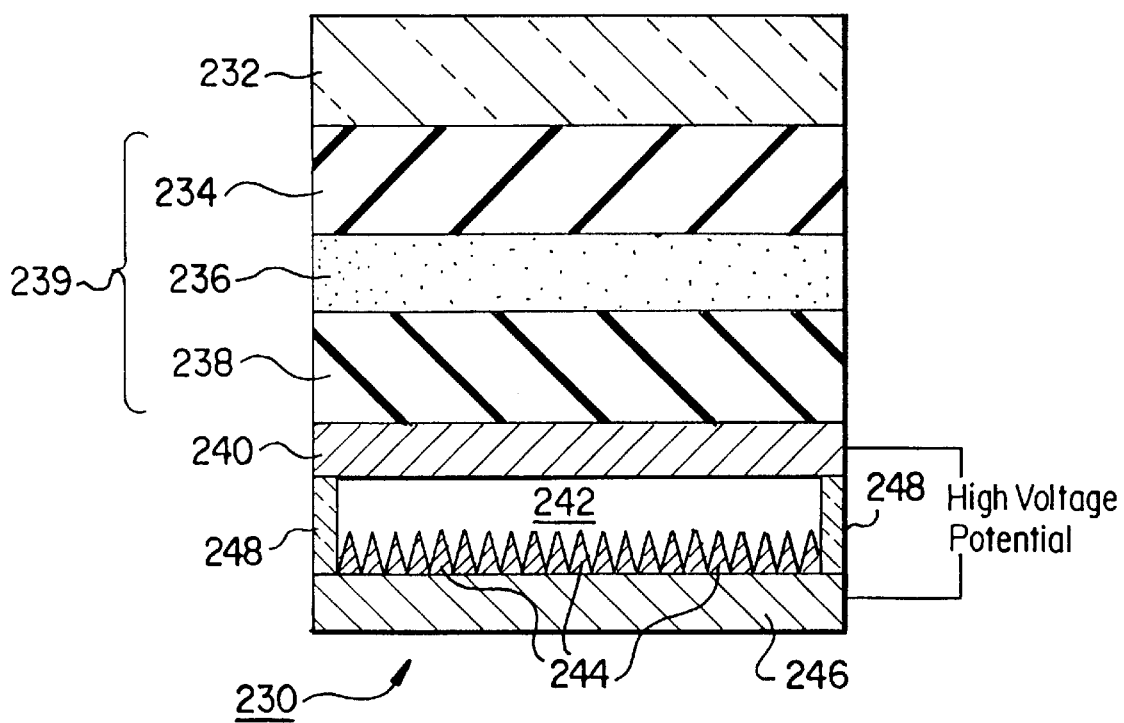
FIG. 15 is a side sectional view of an illustrative embodiment of a resonant microcavity display in accordance with the invention using an array of high voltage field emission devices for excitation of its active layer.

FIG. 15 provides one illustrative embodiment of a monochromatic field emission display 230 incorporating a resonant microcavity 239 comprising an active layer 236 between mirrors 234 and 238. When a positive high voltage is applied between the anode 240 and cathode 246, the electrons are generated by the field emissive material 244, which is sealed within an evacuated region 242 by seals 248. The electrons are then accelerated through the evacuated region 242, penetrate the resonant microcavity 239 and excite the active layer 236. The aluminum layer 240 is approximately 50 nanometer thick and conducts the electrons to ground.

In the low voltage application, the field emissive material must be located inside the RMD due to the limited penetration depth of the low energy electrons. Suitable emissive materials must have a low work function so that a low voltage applied to the material will induce sufficient numbers of electrons to be emitted. In this application, a low voltage is applied across the resonant microcavity and induces electrons to tunnel from the electron emissive material into the phosphor and excite the activators. Under the influence of the applied field, the electrons travel through the phosphor and then into another material which conducts the electrons to ground.

Figure 16:
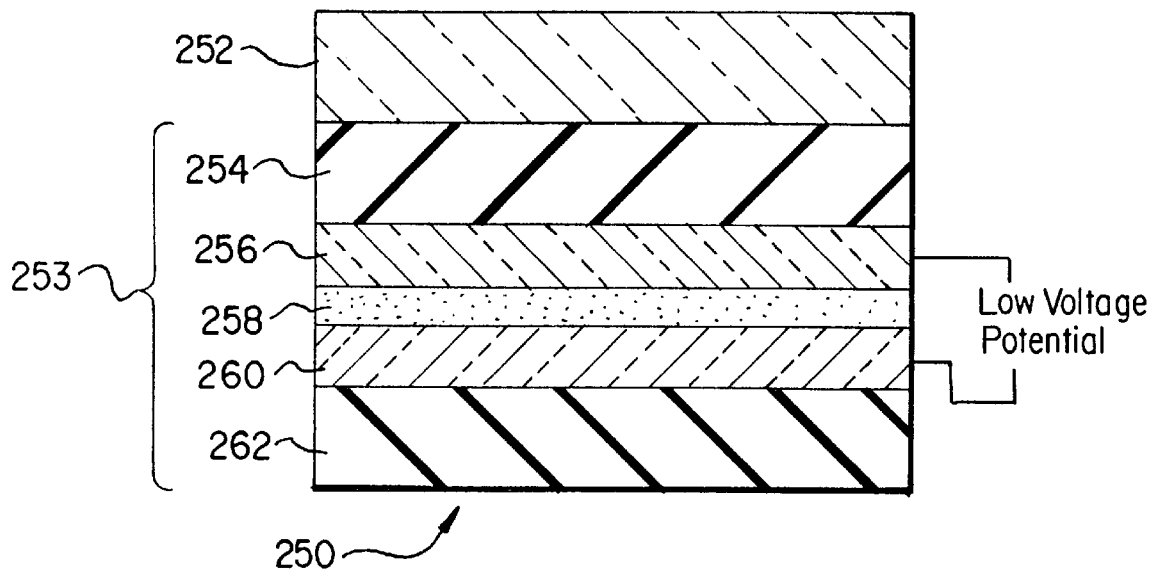
FIG. 16 is a side sectional view of an illustrative embodiment of a resonant microcavity display in accordance with the invention using a low voltage field emission material for excitation of the active layer.

In one illustrative embodiment of a low voltage field emission display 250 illustrated in FIG. 16, the resonant microcavity 253 (which is deposited on substrate 252) would comprise an oriented diamond film layer 256 that is deposited on one side of the phosphor layer 258. Another conductive film layer 260 similar to diamond film layer 256 would be deposited on the opposite side of phosphor layer 258 to conduct the emitted electrons to ground. A low voltage potential would be applied between conductive layers 260 and 256. Reflectors 254, 262 are disposed outside the sandwich-like structure formed by conductive layers 256, 260 and phosphor layer 258. This embodiment is depicted in FIG. 16.

Figure 17:
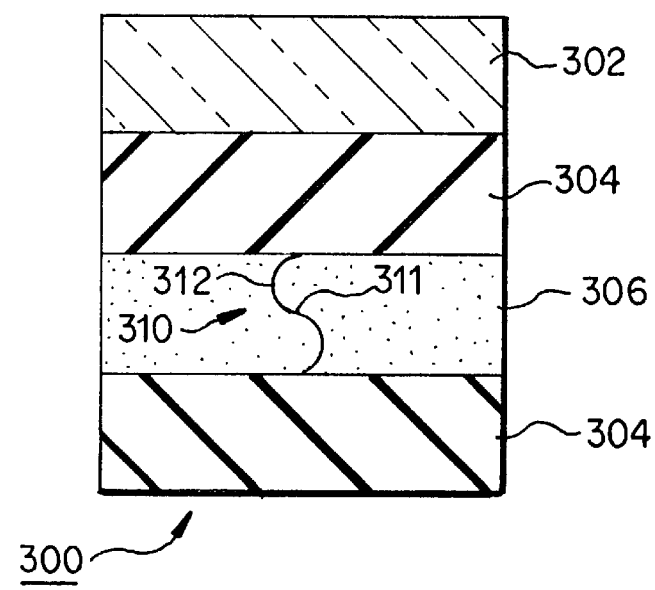
FIG. 17 is a schematic illustration of the standing wave electric field in one illustrative embodiment of a resonant microcavity display in accordance with the invention.

In the case of the simple coplanar microcavity, the key design specification in all the display applications is locating the active layer at or near the antinode of the electric field inside the cavity. In the low voltage field emission display, this specification is critical given the thickness of the active layer. The basic structure of a phosphor layer sandwiched between two emissive layers can be repeated, provided that the phosphor material is located at or near an antinode. An illustration of a standing wave field in one illustrative embodiment of a resonant microcavity display 300 is shown in FIG. 17. Microcavity display 300 comprises a substrate 302, a pair of mirrors 304, and an active layer 306. The electric field amplitude 310 in active layer 306 is shown schematically. A node 311 and an antinode 312 are shown.

The design issues one must consider are fundamentally the same as has been discussed in the other display applications. However, the index of the electron emissive material must now be a major factor in the design of the cavity. An additional concern is the choice of material for the specific applied voltage range.

In addition, the RMD can be embodied in an electroluminescent display. In this display application, a RMD is sandwiched between two conductors. A voltage signal is applied to the conductors and thereby induces what is termed thin film electroluminescence (TFEL). An array of pixel-size elements is constructed to form a luminescent screen creating a TFEL flat panel display.

Figure 18:
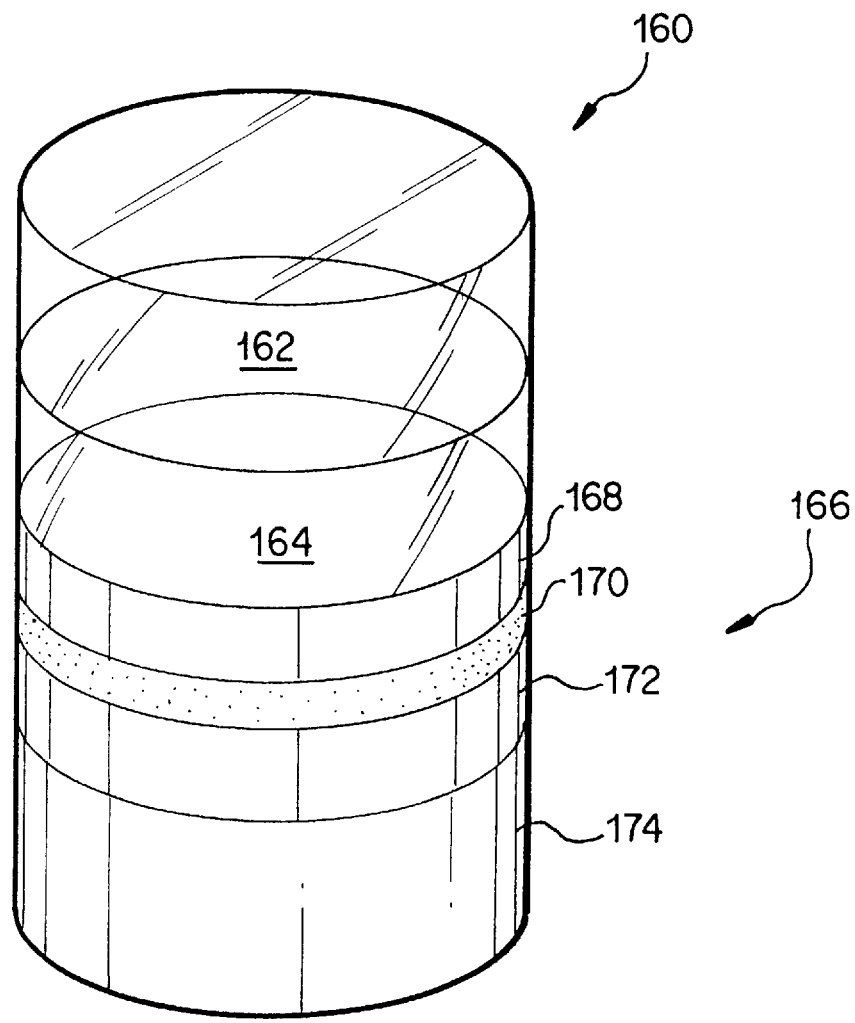
FIG. 18 is a perspective drawing of an illustrative embodiment of a resonant microcavity display in accordance with the invention excited by an electric field.

This embodiment would comprise an array of pixels, where each pixel would be an electrically activated microcavity. FIG. 18 shows one pixel in the array 160. The pixel comprises a visibly transparent substrate 162, a layer of Indium doped Tin Oxide (ITO) 164 (a transparent metal) acts as ground, and a resonant microcavity 166. The resonant microcavity 166 comprises a front reflector 168, a phosphor-based active region 170 and a back reflector 172. Disposed next to the back reflector 172 is an aluminum layer 174, which is deposited on each microcavity in such manner that each cavity is electrically isolated.

This display would be excited by applying a voltage to the aluminum layer 174 of the pixel microcavity 166. The addressing of pixels is common in the art of flat panel display design.

This display would be optimized by measuring the amount of useful light emitted versus the electric field intensity. Particular attention must be paid to the phosphor selected since (in this embodiment) the electroluminescence efficiency is important.

Figure 19:
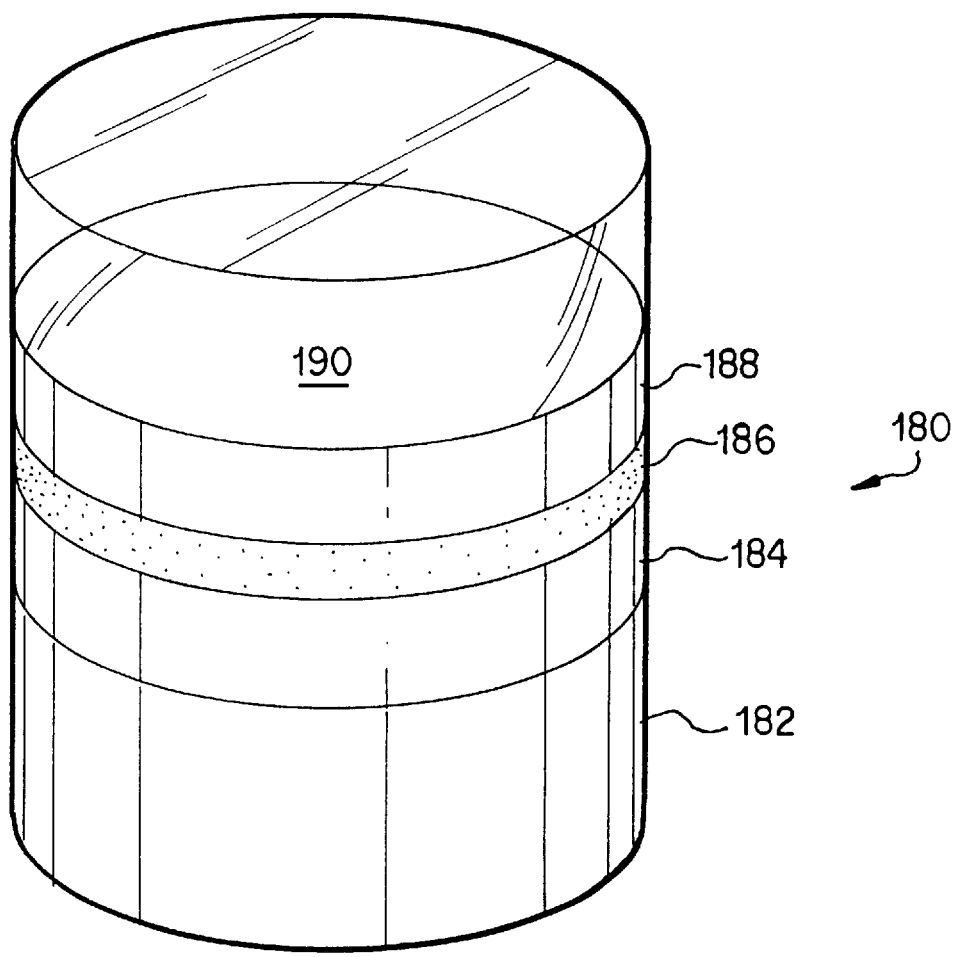
FIG. 19 is a perspective drawing of an illustrative embodiment resonant microcavity display in accordance with the invention excited with ultra-violet light.

Also, the RMD could be embodied as an array of pixels in a flat panel display which uses ultra-violet light to excite the phosphor. As seen in FIG. 19, each pixel 180 would comprise a plasma discharge lamp 182 that generates ultra-violet light which passes through a back reflector 184 and excites the active region 186 (i.e., the phosphor). The emitted light then passes out of the display through the front reflector 188 and the substrate 190.

The RMD concept can also be used to fabricate a transparent direct view flat panel display. This display is visibly transparent except at the specific resonant wavelengths of the microcavities that are used in the display. Both monochrome and full color displays are possible. For example, to create a full color display, one could chose the three wavelengths that correspond to the three fully saturated colors specified by the international CIE color standard for red, green and blue.

The transparent property is created by fabricating resonant microcavities that use reflectors that only function as high efficiency mirrors within a narrow wavelength bandwidth, typically one nanometer or less. Outside this region, the reflectors transmit nearly 100% and thus the RMD appears transparent to the eye. Such narrow band reflectors can be best built using a multiple cavity structure employing dielectric mirrors.

Figure 20:
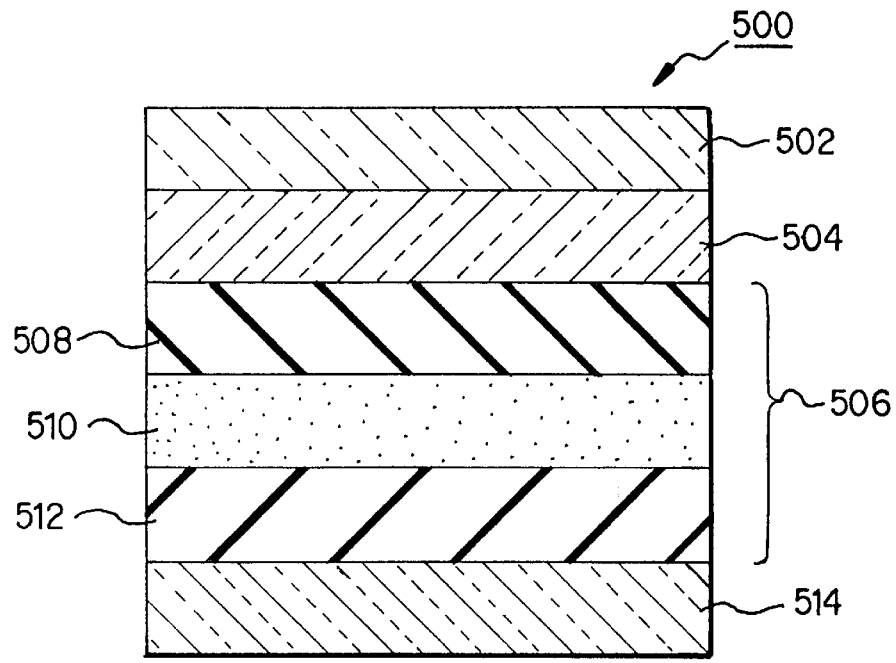
FIG. 20 is a side sectional view of an illustrative embodiment of a transparent resonant microcavity display in accordance with the invention.

In one illustrative embodiment shown in FIG. 20, a flat panel display would consist of an array of pixel size RMDs 500 excited by an electric field. Two transparent electrodes 504, 514 must be connected to either side of each microcavity 506 and could be best fabricated using Indium Tin Oxide (ITO). Microcavity 506 itself would comprise an active layer 510 between mirrors 508, 512.

In addition to creating a transparent display, the same reflector structure can be used to create a high contrast display. In this embodiment, the rear surface is made opaque by another opaque layer (not shown) or by replacing ITO layer 514 with an opaque conductor. External ambient light would be transmitted through the display and then absorbed by the rear layer. The reflection from the front surface would be minimized because of the high transmission properties of the reflectors outside the resonance wavelengths. Such a display can be made to have very high contrast ratios on the order of a 100 or greater. These direct view displays can use any of the three excitation sources.

The use of organic material permits the construction of a RMD out of flexible materials such as plastics.

Figure 21:
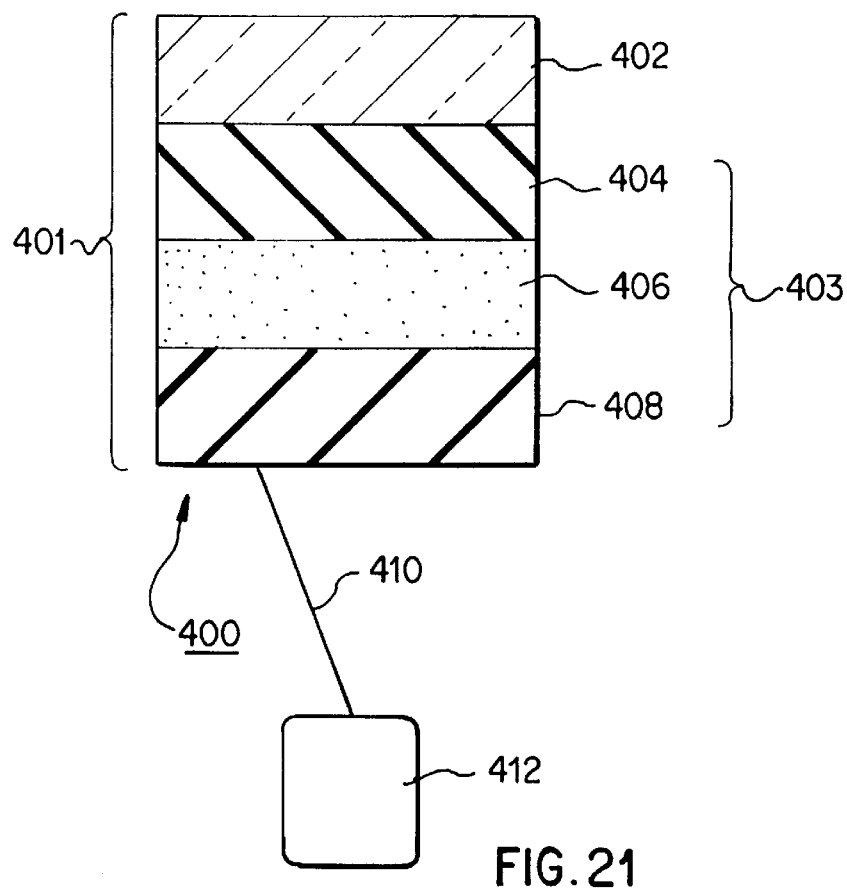
FIG. 21 is a schematic illustration of an illustrative embodiment of a resonant microcavity display in accordance with the invention employing a laser for excitation.

The resonant microcavity display can also be excited using laser light. Laser light results from stimulated emission processes and is distinguished from spontaneous emitted light by the high degree of spatial and/or temporal phase coherence. The laser light would be chosen to have a wavelength that is absorbed by the phosphor. The cavity structure must be designed to pass the laser wavelength. In one embodiment shown in FIG. 21, a laser 412 would be scanned horizontally and vertically across a luminescent screen 401 in a manner similar to the electron beam in a cathode ray tube. The steering of beam 410 is typically accomplished by rotating mirrors and acoustic optic modulators. The ability to write sequential information with lasers is well known in the art. Luminescent screen 401 itself comprises substrate 402 and microcavity 403, including mirrors 404, 408, and active layer 406.

The RMD could also be used in a reverse configuration to absorb light and generate an electric signal. The physics that yields the enhanced emission of light demonstrated in the above display also produces enhanced absorption. The light energy has to be converted into electric energy.

Another application of the resonant microcavity using its property of enhanced absorption is in field of photography. In this application, the film would comprise resonant microcavities in which the active layer includes a photosensitive material. As a result, this film would absorb only at certain wavelengths corresponding to the three primaries. Since the amount of absorption can be precisely controlled, the film would be capable of extremely accurate color reproduction. Information could also be recorded by deriving an electrical signal from the photosensitive material within the microcavity. The general design would be similar to digital cameras employing charge coupled detectors.

The unique ability of an RMD to influence the emission characteristics may also be used in memory storage devices. As explained earlier, the confinement of an optical material in a resonant microcavity affects the decay rate. Depending on whether the cavity is in resonance with the transition energy of the optical material or not, the lifetime is either decreased or increased. It is therefore possible to significantly enhance the lifetime of the material and to use this effect to store information.

Another possible way to store information with a resonant microcavity would be based on hole burning. This process and its application for the storage of information is well known. By putting the material in a resonant microcavity one could not only use the enhanced absorption but also the earlier described effect of increased lifetime to make the hole burning process more efficient.

Figure 22:
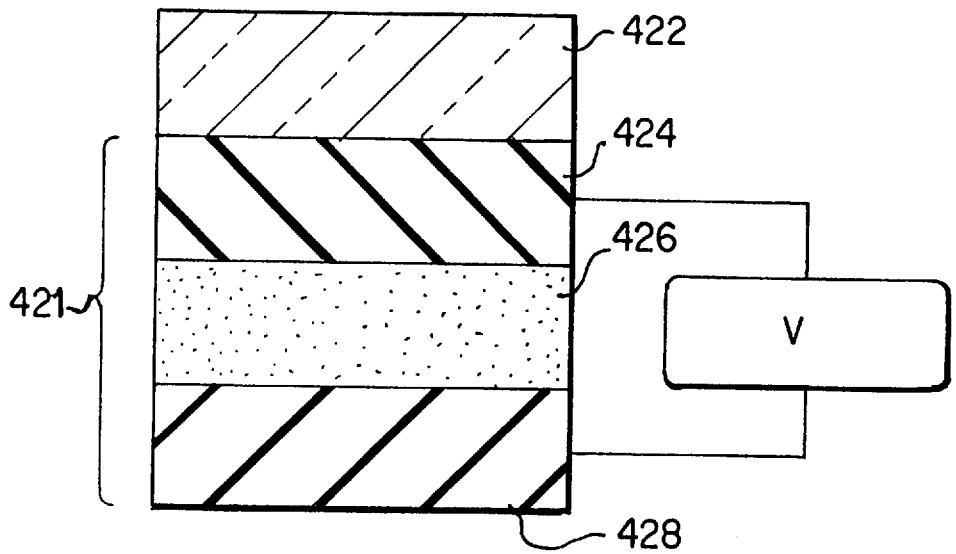
FIG. 22 is a schematic illustration of an illustrative embodiment of a tunable resonant microcavity display in accordance with the invention.

RMDs could also be used in the design of light valves. This would require two RMD's. One RMD without a phosphor would be grown on top of a RMD with a phosphor. The first RMD would modulate the intensity of the light emanating from the second RMD. The modulator would work by tuning the first RMD to its resonant frequency or tune it away from its resonant frequency. The process of tuning the first RMD (using the electro-optic or the piezo-electric effect) would be achieved by applying a voltage to the first RMD. This modulator could also be used as a switch by turning the light completely on and completely off. A modulated RMD 421 grown on substrate 422 is shown in FIG. 22. In this figure, RMD 421, comprising mirrors 424, 428 with active layer 426 between, is modulated by applying a voltage V to mirror layers 424 and 428. This modulation can be accomplished using either electro-optic or piezo-electric effects.

The ability to tune the cavity resonance using, for example, electro-optic or piezo-electric effects, would allow the RMD to be utilized in a variety of communication modes. Resonant microcavities could be designed to emit light and receive light over a range of frequencies and solid angles. These frequencies and solid angles could be modified by applying electric signals. Thus RMDs could be used to send and receive information. Friend or foe identifiers used in military equipment would be one possible use.

Using RMD's in a Plasma Display Panel could also be used to build a fluorescence lamp. Compared to common fluorescence lamps the RMD lamp has the advantage of strongly enhanced fluorescence which results in a greater efficiency. A single RMD lamp would emit light of a certain wavelength. This is useful for applications such as stage-lamps. Common stage lamps emit over the UV, the visible and the infrared region and use filters to select a certain wavelength (color). This filter-process makes the lamp very inefficient since most of the light is not allowed to exit the lamp. In contrast, the RMD lamp creates only light of a certain wavelength and does therefore not require a filter. The efficiency is therefore much higher. The combination of a R, G and B device would result in a white light source.

In general, any light source can in principle be substituted by the resonant microcavity display. For example, incandescent lights are typically filtered to produce colored lights for car tail lights and traffic signal lights. Resonant microcavities can replace these current light sources with highly efficient single color and directional light sources. Excitation could use any of the means already discussed.

In non-emissive displays, the light source and image producing surface are separate. The image is typically formed using a light valve which modulates the light produced by the light source. A common light valve display uses a combination of one or more liquid crystals and polarizers and forms what is called a liquid crystal display (LCD). Light valves are used in both reflection and transmission and find use in both projection and direct view applications. The pixel size is determined solely by the light modulator.

In each application, a sufficiently bright light source is required. Often the display also requires full color capability. Currently for flat panel application, a fluorescence lamp is used as a backlight and creates the white light that is then modulated by a LCD panel. To create a full color flat panel display, color filters are inserted at each pixel to filter the white light and generate the three primary colors.

The RMD can be incorporated in such flat panel display applications and form the light source. For a monochromatic display, the modulator would be attached to one large area resonant microcavity. The microcavity can be excited by any one of the three excitation means. Full color would be best generated by an array of microcavities consisting of alternating stripes in which each striped region is constructed to form one continuous resonant microcavity designed to generate one color.

For projection devices, an arc lamp is used to generate a white light source and the color is typically generated by using dichroic filters to separate the three primary color components of the white light. Instead, the three colors can be produced by three independent resonant microcavities or by producing an array of microcavities.

In addition, a LCD modulator requires the input light to be initially polarized and uses a polarizer located in the input. It is possible to eliminate this polarizer by designing the resonant microcavity to generate polarized light. This can be accomplished in a number of ways. For example, the region between the mirrors can be fabricated using birefringent material in such a manner the cavity will resonate at different frequencies depending on the polarization of the light. The cavity can be designed so that only one polarized light component will resonate at the desired frequency.

The principal advantage of using resonant microcavities to generate the light used for light modulators is the increased light output efficiency. The RMD light source will produce high brightness levels and is highly directional. The latter is particularly useful for LCD applications since the input light must be contained within a certain range of solid angle. In addition, the elimination of color filters and dichroic beam splitters will increase the overall throughput. The other engineering advantage is the compact nature of the RMD which is particularly useful for flat panel applications.

Figure 23:
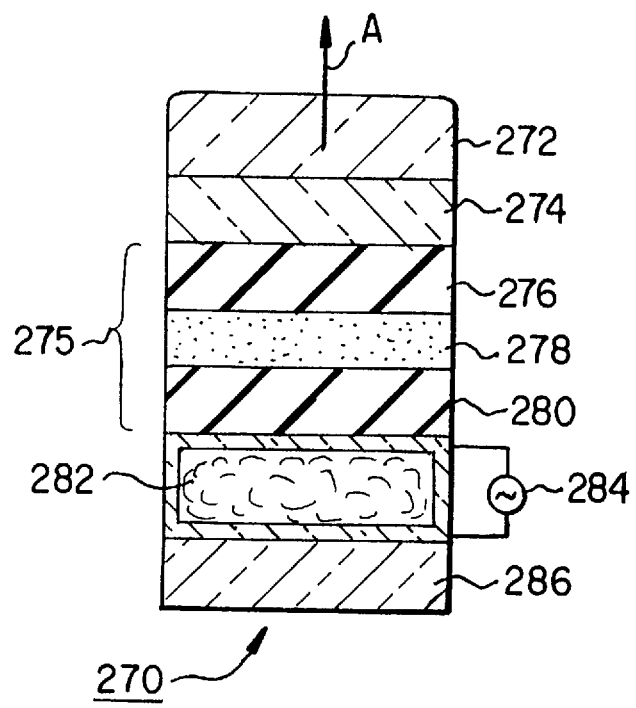
FIG. 23 is a schematic illustration of an illustrative embodiment of a resonant microcavity display in accordance with the invention used as a light source for a liquid crystal display light valve application.

In one illustrative embodiment shown in FIG. 23, a monochromatic flat panel display 270 is depicted. In this example, the resonant microcavity 275 is excited by UV light generated by a plasma discharge 282 excited by a source 284 of AC power. Any damaging UV that leaks out past microcavity 275 is absorbed by substrate 274; another UV blocking substrate 286 may also be used on the other side of plasma discharge 282. The light valve uses an LCD 272 to modulate the light. LCD 272 can be addressed in a number of modes and this specification is not affected by using the resonant microcavity. The key design considerations for the microcavity would involve the divergence of the light, the light polarization, brightness and resonance wavelength.

The above embodiments are given as illustrative examples and are not intended to impose any limitations on the invention.

What is claimed is:

1. A luminescent display comprising a resonant microcavity with an active region, the active region having a phosphor disposed therein for emitting light:
   wherein said microcavity comprises means for modifying a process selected from the group consisting of spontaneous emission processes of the phosphor and energy transfer processes of the phospor;
   wherein said microcavity comprises:
      (a) a substrate; and
      (b) a structure disposed upon said substrate comprising the active region and a plurality of reflective regions;
   wherein the plurality of reflective regions comprise:
      (c) a front reflective region disposed upon said substrate, and
      (d) a back reflective region;
   wherein the active region is disposed between the front and the back reflective regions; and
   wherein the front reflective region, the active region, and the back reflective region comprise thin films.

2. A luminescent display comprising a resonant microcavity with an active region, the active region having a phosphor disposed therein for emitting light;
   wherein said microcavity comprises means for modifying a process selected from the group consisting of spontaneous emission processes of the phosphor and energy transfer processes of the phospor;
   wherein said microcavity comprises:
      (a) a substrate; and
      (b) a structure disposed upon said substrate comprising the active region and a plurality of reflective regions; and
   wherein the substrate comprises an organic material.

3. A luminescent display comprising a resonant microcavity with an active region, the active region having a phosphor disposed therein for emitting light;
   wherein said microcavity comprises means for modifying a process selected from the group consisting of spontaneous emission processes of the phosphor and energy transfer processes of the phospor;
   wherein said microcavity comprises:
      (a) a substrate; and
      (b) a structure disposed upon said substrate comprising the active region and a plurality of reflective regions; and
   wherein the active region comprises an organic material.

4. A luminescent display comprising a resonant microcavity with an active region, the active region having a phosphor disposed therein for emitting light;
   wherein said microcavity comprises means for modifying a process selected from the group consisting of spontaneous emission processes of the phosphor and energy transfer processes of the phospor;
   wherein said microcavity comprises:
      (a) a substrate; and
      (b) a structure disposed upon said substrate comprising the active region and a plurality of reflective regions; and
   wherein the reflective regions are comprised of an organic material.

5. A luminescent display comprising a resonant microcavity with an active region, the active region having a phosphor disposed therein for emitting light;
   wherein said microcavity comprises means for modifying a process selected from the group consisting of spontaneous emission processes of the phosphor and energy transfer processes of the phospor;
   wherein said microcavity comprises:
      (a) a substrate; and
      (b) a structure disposed upon said substrate comprising the active region and a plurality of reflective regions; and
   wherein the substrate, the active region, and the plurality of reflective regions each comprise organic materials.

6. A luminescent display comprising a resonant microcavity with an active region, the active region having a phosphor disposed therein for emitting light;
   wherein said microcavity comprises means for modifying a process selected from the group consisting of spontaneous emission processes of the phosphor and energy transfer processes of the phospor;
   wherein said microcavity comprises:
      (a) a substrate; and
      (b) a structure disposed upon said substrate comprising the active region and a plurality of reflective regions; and
   in which said substrate and said structure disposed thereon are flexible.

7. A luminescent display comprising a resonant microcavity with an active region, the active region having a phosphor disposed therein for emitting light;
   wherein said microcavity comprises means for modifying a process selected from the group consisting of spontaneous emission processes of the phosphor and energy transfer processes of the phospor;
   wherein said microcavity comprises:
      (a) a substrate; and
      (b) a structure disposed upon said substrate comprising the active region and a plurality of reflective regions; and
   in which at least one of the plurality of reflective regions comprises a photonic band gap material.

8. A luminescent display comprising a resonant microcavity with an active region, the active region having a phosphor disposed therein for emitting light;

wherein said microcavity comprises means for modifying a process selected from the group consisting of spontaneous emission processes of the phosphor and energy transfer processes of the phospor;

wherein said microcavity comprises:

(a) a substrate; and (b) a structure disposed upon said substrate comprising the active region and a plurality of reflective regions; and in which the active region comprises a photonic band gap material.

* * * * *